US012652805B2

(12) United States Patent
Suh et al.

(10) Patent No.: US 12,652,805 B2
(45) Date of Patent: Jun. 9, 2026

(54) SEMICONDUCTOR DEVICE INCLUDING BARRIER DIELECTRIC LAYER INCLUDING FERROELECTRIC MATERIAL

(71) Applicant: SK hynix Inc., Gyeonggi-do (KR)

(72) Inventors: Dong Ik Suh, Gyeonggi-do (KR); Won Tae Koo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 582 days.

(21) Appl. No.: 18/097,493

(22) Filed: Jan. 17, 2023

(65) Prior Publication Data

US 2024/0081082 A1 Mar. 7, 2024

(30) Foreign Application Priority Data

Aug. 26, 2022 (KR) ........................ 10-2022-0107769

(51) Int. Cl.
H10B 53/30 (2023.01)
H10D 1/68 (2025.01)

(52) U.S. Cl.
CPC ............. H10B 53/30 (2023.02); H10D 1/684 (2025.01)

(58) Field of Classification Search
CPC ........ H10B 53/30; H10B 51/30; H10B 12/31;
H10D 1/716; H10D 30/701; H10D 64/689; H10D 1/684; H10D 1/68; H10D 64/685; H10D 64/691; H10D 30/62
See application file for complete search history.

(56) References Cited

U.S. PATENT DOCUMENTS

| | | | |
|---|---|---|---|
| 10,128,327 B2 * | 11/2018 | Zhang | ................. H10D 64/033 |
| 2010/0172065 A1 * | 7/2010 | Huang | .................... H10D 1/68 |
| | | | 361/313 |
| 2019/0051722 A1 | 2/2019 | Zhang | |
| 2020/0286985 A1 * | 9/2020 | Lim | ................. H01L 21/28247 |
| 2021/0043654 A1 * | 2/2021 | Yoo | ........................ H10B 51/00 |

FOREIGN PATENT DOCUMENTS

| | | | | |
|---|---|---|---|---|
| KR | 10-2020-0115693 A | 10/2020 | | |
| KR | 20240029397 A | * | 3/2024 | ........... H10D 30/701 |

* cited by examiner

*Primary Examiner* — Andres Munoz
(74) *Attorney, Agent, or Firm* — IP & T GROUP LLP

(57) ABSTRACT

A semiconductor device according to an embodiment includes a first electrode and a second electrode that are spaced apart from each other, a capacitor dielectric structure disposed between the first electrode and the second electrode, and a barrier dielectric layer disposed between one of the first and second electrodes and the capacitor dielectric structure. The capacitor dielectric structure may include a ferroelectric layer and a dielectric layer. The barrier dielectric layer may include a ferroelectric material.

21 Claims, 35 Drawing Sheets

401

450a

440a

430a

420a

2001

410a

SEMICONDUCTOR DEVICE INCLUDING BARRIER DIELECTRIC LAYER INCLUDING FERROELECTRIC MATERIAL

CROSS-REFERENCE TO RELATED APPLICATIONS

The present application claims priority under 35 U.S.C. 119(a) to Korean Application No. 10-2022-0107769, filed on Aug. 26, 2022, which is incorporated herein by reference in its entirety.

BACKGROUND

1. Technical Field

The present disclosure generally relates to a semiconductor device and, more particularly, to a semiconductor device including a barrier dielectric layer.

2. Related Art

As the feature size of a semiconductor chip decreases, the size of a unit device such as a capacitor device or a transistor device disposed in the semiconductor chip also decreases. However, in spite of the reduction in the size of the unit device, the capacitance required for the dielectric layer constituting the unit device is required to exceed a certain reference value in order to guarantee the operational reliability of the unit device. Accordingly, various studies are being conducted to improve the capacitance characteristics of the dielectric layer applied to the unit device.

As a representative method of improving the capacitance of the dielectric layer, a method of applying a high-k material to a dielectric layer of the unit device in a thin thickness has been attempted. However, when the thickness of the dielectric layer is excessively reduced, there is a difficulty in that leakage current characteristics and the breakdown voltage characteristics of the dielectric layer are deteriorated. Hence, improved technologies addressing these technical challenges are needed.

SUMMARY

A semiconductor device according to an embodiment of the present disclosure may include a first electrode and a second electrode that are spaced apart from each other, a capacitor dielectric structure disposed between the first electrode and the second electrode, and a barrier dielectric layer disposed between one of the first and second electrodes and the capacitor dielectric structure. The capacitor dielectric structure may include a ferroelectric layer and a dielectric layer. The barrier dielectric layer may include a ferroelectric material.

A semiconductor device according to another embodiment of the present disclosure may include a substrate including a channel region, a gate dielectric structure disposed over the channel region, a gate electrode disposed over the gate dielectric structure, and a barrier dielectric layer disposed between the channel region and the gate dielectric structure or between the gate dielectric structure and the gate electrode. The capacitor dielectric structure may include a ferroelectric layer and a dielectric layer. The barrier dielectric layer may include a ferroelectric material.

A semiconductor device according to an embodiment of the present disclosure may include a substrate, an active layer disposed over the substrate, a gate dielectric structure disposed over the active layer, a gate electrode disposed adjacent to the gate dielectric structure, and a barrier dielectric layer disposed between the active layer and the gate dielectric structure or between the gate dielectric structure and the gate electrode. The gate dielectric structure may include a ferroelectric layer and a dielectric layer. The barrier dielectric layer may include a ferroelectric material.

DETAILED DESCRIPTION

Figure 1:
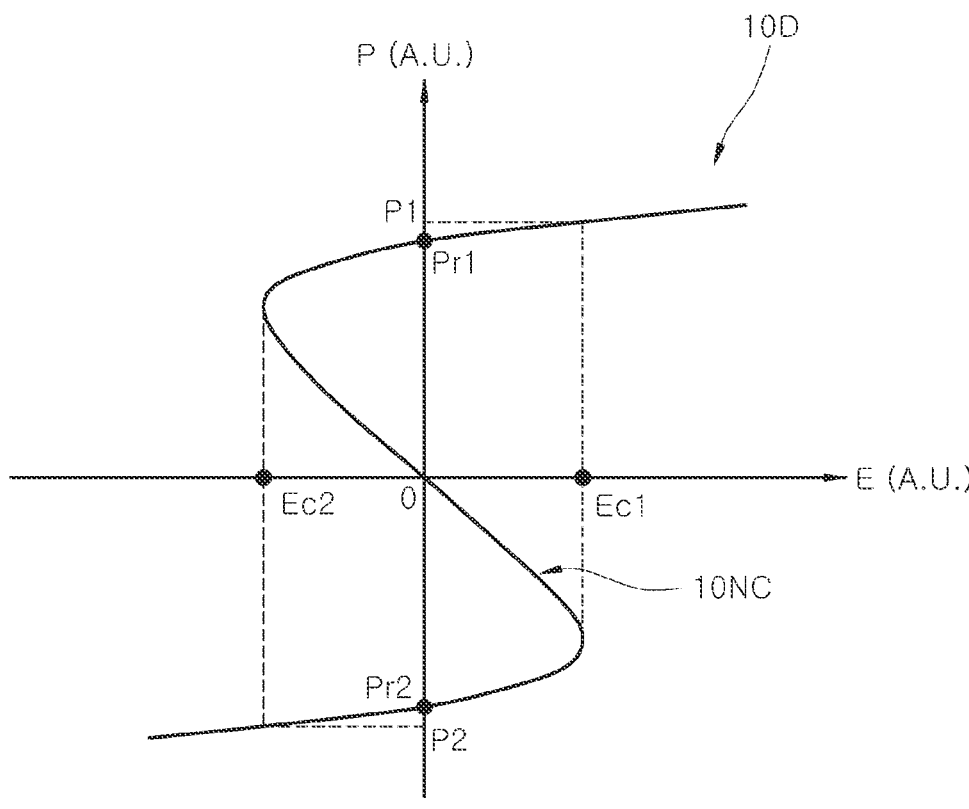
FIG. 1 is a graph schematically illustrating polarization characteristics of a ferroelectric layer according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

According to an embodiment of the present disclosure, a semiconductor device may include a dielectric structure and a barrier dielectric layer disposed between a first electrode and a second electrode. The dielectric structure may include a ferroelectric layer and a dielectric layer. In this specification, unless otherwise specified, the dielectric layer may have non-ferroelectricity. The non-ferroelectricity may mean that the dielectric material of the dielectric layer has no remanent polarization and no coercive field. For example, the dielectric layer may be a paraelectric layer. The barrier dielectric layer may be disposed between one of the first electrode and the second electrode and the dielectric structure. The barrier dielectric layer may include a ferroelectric material.

FIG. 1 is a graph schematically illustrating the polarization behavior of a ferroelectric layer 10D according to an embodiment of the present disclosure. Specifically, FIG. 1 may represent a change in polarization P of the ferroelectric layer 10D when an electric filed E is applied to both ends of the ferroelectric layer 10D. For example, FIG. 1 may be a graph schematically illustrating the behavior of the polarization P of the ferroelectric layer 10D derived from the Landau-Ginzburg-Devonshire (LGD) theory.

Referring to FIG. 1, the ferroelectric layer 10D may have first and second coercive fields Ec1 and Ec2 depending on an electric filed applied from the outside of the ferroelectric layer 10D. The ferroelectric layer 10D may have first and second remanent polarization Pr1 and Pr2 and on the graph of FIG. 1. The first and second remanent polarization Pr1 and Pr2 may be spontaneous polarization maintained in the ferroelectric layer 10D in a state in which no electric field is applied to the ferroelectric layer 10D. The first and second coercive fields Ec1 and Ec2 may be electric fields required to respectively switch the orientation of the spontaneous polarization maintained in the ferroelectric layer 10D in opposite directions.

Referring to FIG. 1, as an example, an electric field E having a positive polarity may be applied to the ferroelectric layer 10D having the second remanent polarization Pr2 in an initial state in which no electric field is applied. The electric field E may be applied to the ferroelectric layer 10D while increasing in magnitude in a sweep manner. In an embodiment, when the electric field E reaches the first coercive field Ec1, the polarization of the ferroelectric layer 10D may be changed to reach first polarization P1 after passing through a negative slope portion 10NC. When the electric field E is removed, the ferroelectric layer 10D may have the first remanent polarization Pr1.

As another example, in an initial state in which no electric field is applied, an electric field E having a negative polarity may be applied to the ferroelectric layer 10D having the first remanent polarization Pr1. The electric field E may be applied to the ferroelectric layer while increasing in magnitude in a sweep manner. In an embodiment, when the electric field E reaches the second coercive field Ec2, the polarization of the ferroelectric layer 10D may be changed to reach the second polarization P2 after passing through the negative slope portion 10NC. When the electric field E is removed, the ferroelectric layer 10D may have the second remanent polarization Pr2.

The capacitance of the ferroelectric layer 10D may be proportional to an absolute value of the ratio ΔP/ΔE of a polarization change ΔP depending on an electric field change ΔE on the graph of FIG. 1. Accordingly, in the electric field section corresponding to the negative slope portion 10NC of the graph of FIG. 1, the ferroelectric layer 10D may exhibit a negative capacitance in which the ratio ΔP/ΔE has a negative value.

In an embodiment, when the ferroelectric layer 10D performs polarization switching in the electric fields corresponding to the first and second coercive fields Ec1 and Ec2, the ferroelectric layer 10D may pass through the negative slope portion 10NC of the graph, implementing a negative capacitance. Conversely, in the range of the remaining electric fields except for the electric fields corresponding to the first and second coercive fields Ec and Ec2, the ferroelectric layer 10D may exhibit a positive capacitance in which the ratio ΔP/ΔE has a positive value.

In an embodiment, in FIG. 1, the polarization behavior in which the ferroelectric layer 10D exhibits a negative capacitance may appear stably when the ferroelectric layer 10D is bonded to a dielectric layer (hereinafter, referred to as P10) having non-ferroelectricity. In an embodiment, in order to exhibit the polarization behavior of FIG. 1, an absolute value of the capacitance of the ferroelectric layer 10D may be greater than an absolute value of the capacitance of the dielectric layer P10.

Figure 3:
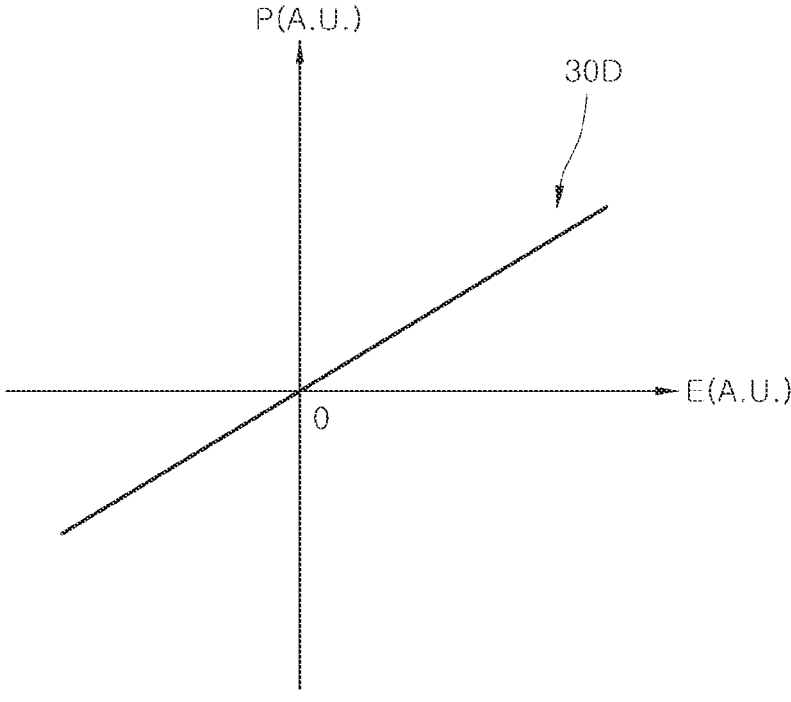
FIG. 3 is a graph schematically illustrating polarization behavior of a dielectric layer having non-ferroelectricity according to an embodiment of the present disclosure.

In an embodiment, the dielectric layer P10 may have the polarization characteristics of a dielectric layer 30D shown in FIG. 3. Referring to FIG. 3, in an initial state in which no electric field is applied, the dielectric layer 30D may not have remanent polarization. When an electric field E is applied to both ends of the dielectric layer 30D while sweeping in a positive or negative direction, the magnitude of the polarization of the dielectric layer 30D may increase from zero (0) in proportion to the magnitude of the applied electric field E. When the electric field is removed from the dielectric layer 30D, the magnitude of the polarization may return to zero (0). The capacitance of the dielectric layer 30D may be proportional to the ratio ΔP/ΔE of the polarization change ΔP depending on the electric field change ΔE on the graph of FIG. 3. Accordingly, the dielectric layer 30D may have a positive capacitance in the entire electric field section.

Figure 2:
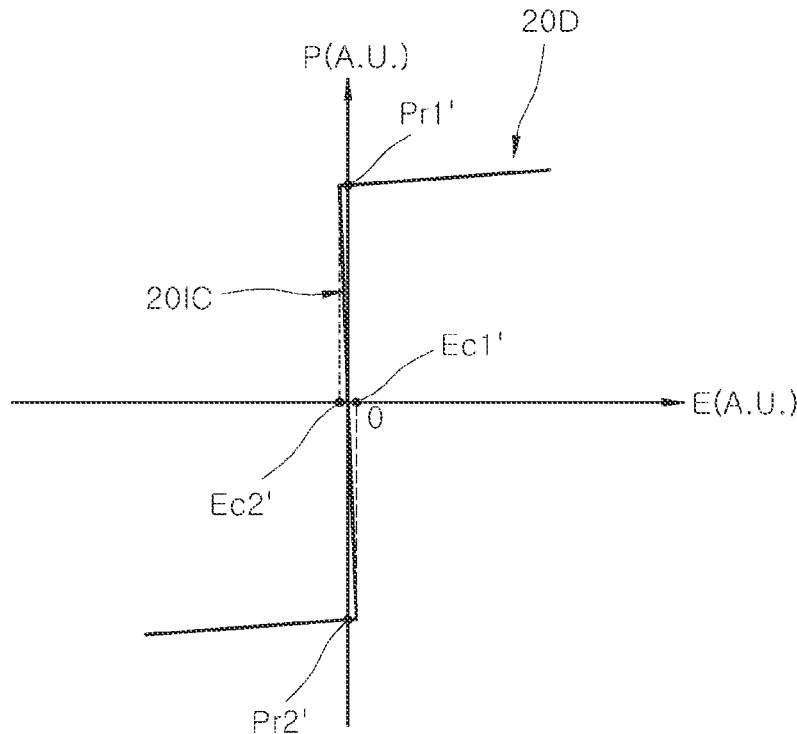
FIG. 2 is a graph schematically illustrating polarization behavior of a ferroelectric layer according to another embodiment of the present disclosure.

FIG. 2 is a graph schematically illustrating the polarization behavior of a ferroelectric layer 20D according to another embodiment of the present disclosure. Referring to FIG. 2, the ferroelectric layer 20D may have first and second coercive fields Ec1' and Ec2' depending on an electric field E applied to the ferroelectric layer 20D from the outside. In an embodiment, the ferroelectric layer 20D may have a negative slope portion 20IC of the graph of FIG. 2 in an electric field section between the first coercive field Ec1' and the second coercive field Ec2'. The ferroelectric layer 20D may have first and second remanent polarization Pr1' and Pr2' of the graph of FIG. 2 after the applied electric field E is removed.

In an embodiment, in the ferroelectric layer 20D of FIG. 2, the magnitude of each of the first and second coercive fields Ec1' and Ec2' may be smaller than that of the ferroelectric layer 10D of FIG. 1. Accordingly, as an example, when an electric field E is applied to the ferroelectric layer 20D in the initial state having the first remanent polarization Pr1' or the second remanent polarization Pr2', the polarization switching of the ferroelectric layer 20D may occur immediately, and the magnitude of the polarization of the ferroelectric layer 20D may increase.

In an embodiment, in the electric field section between the first and second coercive fields Ec1' and Ec2' shown in FIG. 2, the ratio ΔP/ΔE of the polarization change ΔP according to the electric field change DE of the ferroelectric layer 20D may have a negative value. In this case, the absolute value of the polarization change ratio ΔP/ΔE of the ferroelectric layer 20D between the first and second coercive fields Ec1' and Ec2' shown in FIG. 2 may be greater than the absolute value of the polarization change ratio ΔP/ΔE of the ferroelectric layer 10D between the first and second coercive fields Ec1 and Ec2 of FIG. 1. For example, the absolute value of the ratio ΔP/ΔE of the polarization change of the ferroelectric layer 20D may be 10 or more. As another example, the absolute value of the ratio ΔP/ΔE of the polarization change of the ferroelectric layer 20D may be 20 or more. As further another example, the absolute value of the ratio ΔP/ΔE of the polarization change of the ferroelectric layer 20D may be 50 or more.

As a result, when an electric field E is applied in the initial state, the ferroelectric layer 20D may have a very large capacitance value proportional to the absolute value of the ratio ΔP/ΔE of the polarization change ΔP between the first and second coercive fields Ec1' and Ec2'. For example, the fact that the ferroelectric layer 20D has a very large capacitance value may mean that the absolute value of the ratio ΔP/ΔE of the polarization change ΔP according to the electric field change ΔE of the ferroelectric layer 20D is 10 or more.

In an embodiment, the polarization behavior of the ferroelectric layer 20D having the very large capacitance shown in FIG. 2 may be stably realized when the ferroelectric layer 20D is bonded to a dielectric layer (hereinafter, referred to as P20) having non-ferroelectricity under a predetermined condition. For example, the dielectric layer P20 having non-ferroelectricity may have the polarization characteristics of the dielectric layer 30D shown in FIG. 3.

In an embodiment, in order to exhibit the polarization behavior of FIG. 2, the ratio of the thickness of the ferroelectric layer 20D over the thickness+ of the dielectric layer P20 may be within a predetermined range. For example, the thickness of the ferroelectric layer 20D may be smaller than the thickness of the dielectric layer P20, and therefore the thickness ratio of the thickness of the ferroelectric layer 20D over the thickness of the dielectric layer P20 may be less than 1. For example, the thickness of the ferroelectric layer 20D may be 1 nm to 5 nm.

In an embodiment, thicknesses of the ferroelectric layer 20D and the dielectric layer P20 for exhibiting the polarization behavior of FIG. 2 may satisfy Equation (1) below with respect to the thicknesses of the ferroelectric layer 10D and the dielectric layer P10 showing the polarization behavior of FIG. 1.

$$T_{20D}/T_{p20} < T_{10D}/T_{p10} \tag{1}$$

$T_{10D}$ is the thickness of the ferroelectric layer 10D and $T_{20D}$ is the thickness of the ferroelectric layer 20D. $T_{p10}$ is the thickness of the dielectric layer P10 bonded to the ferroelectric layer 10D, and $T_{p20}$ is the thickness of the dielectric layer P20 bonded to the ferroelectric layer 20D.

Referring to Equation (1), the ratio of the thickness of the ferroelectric layer 20D to the thickness of the dielectric layer P20 may be smaller than the ratio of the thickness of the ferroelectric layer 10D to the thickness of the dielectric layer P10, which exhibits the polarization behavior of FIG. 1.

In an embodiment, in order to exhibit the polarization behavior of FIG. 2, as shown in Equation (2) below, an absolute value of the capacitance of the ferroelectric layer 20D may be greater than an absolute value of the capacitance of the dielectric layer P20.

$$|C_{20D}| > |C_{P20}| \qquad (2)$$

$|C_{20D}|$ and $|C_{P20}|$ may be an absolute value of the capacitance of the ferroelectric layer 20D and an absolute value of the capacitance of the dielectric layer P20, respectively.

For example, the absolute value of the capacitance of the ferroelectric layer 20D may be 2 to 10 times the absolute value of the capacitance of the dielectric layer P20. As another example, the absolute value of the capacitance of the ferroelectric layer 20D may be greater than 10 times the absolute value of the capacitance of the dielectric layer P20.

In an embodiment, the capacitances of the ferroelectric layer 20D and the dielectric layer P20 to exhibit the polarization behavior of FIG. 2 may satisfy the following Equation (3) with respect to the capacitances of the ferroelectric layer 10D and the dielectric layer P10 exhibiting the polarization behavior of FIG. 1.

$$|C_{20D}|/|C_{P20}| > |C_{10D}|/|C_{P10}| \qquad (3)$$

$|C_{10D}|$ and $|C_{20D}|$ are an absolute value of the capacitance of the ferroelectric layer 10D and an absolute value of the capacitance of the ferroelectric layer 20D, respectively. $|C_{P10}|$ is an absolute value of the capacitance of the dielectric layer P10 bonded to the ferroelectric layer 10D, and $|C_{P20}|$ is an absolute value of the capacitance of the dielectric layer P20 bonded to the ferroelectric layer 20D.

Referring to Equation (3), the ratio of the absolute value of the capacitance of the ferroelectric layer 20D to the absolute value of the capacitance of the dielectric layer P20 may be greater than the ratio of the absolute value of the capacitance of the ferroelectric layer 10D to the absolute value of the capacitance of the dielectric layer P10 for exhibiting the polarization behavior of FIG. 1.

Although not necessarily explained by one theory, according to one of various theories, the polarization characteristics of the ferroelectric layer 20D with reference to FIG. 2 may be described as follows. When the ferroelectric layer 20D having spontaneous polarization in a first direction and the non-ferroelectric dielectric layer P20 are bonded, a depolarization electric field that suppresses the spontaneous polarization in the first direction may be generated in an inner direction of the ferroelectric layer 20D at an interface between the ferroelectric layer 20D and the dielectric layer P20. The depolarization electric field may be formed in a second direction opposite to the first direction. In this case, in order to relieve the depolarization field, first domains having a polarization orientation in the first direction and second domains having a polarization orientation in a second direction substantially opposite to the first direction may be alternately formed in the ferroelectric layer 20D. As a result, the ferroelectric layer 20D may have a stripe-shaped domain structure including a plurality of the first domains and a plurality of the second domains. In this case, as described above, when the ferroelectric layer 20D and the dielectric layer P20 are bonded under the predetermined condition, the size of each of the first and second domains may be reduced to a size of two or three crystallographic unit cells or less of the ferroelectric layer 20D, and the ferroelectric layer 20D may exhibit the ferroelectric characteristics as shown in FIG. 2. For example, one unit cell of the ferroelectric layer 20D may have a size of about 5 Å.

When the ferroelectric layer 20D has the polarization characteristics of FIG. 2 through bonding with the dielectric layer P20, the dielectric structure including the bonded ferroelectric layer 20D and the dielectric layer P20 may exhibit non-ferroelectricity as a whole. For example, the dielectric structure may exhibit paraelectricity.

Figure 4:
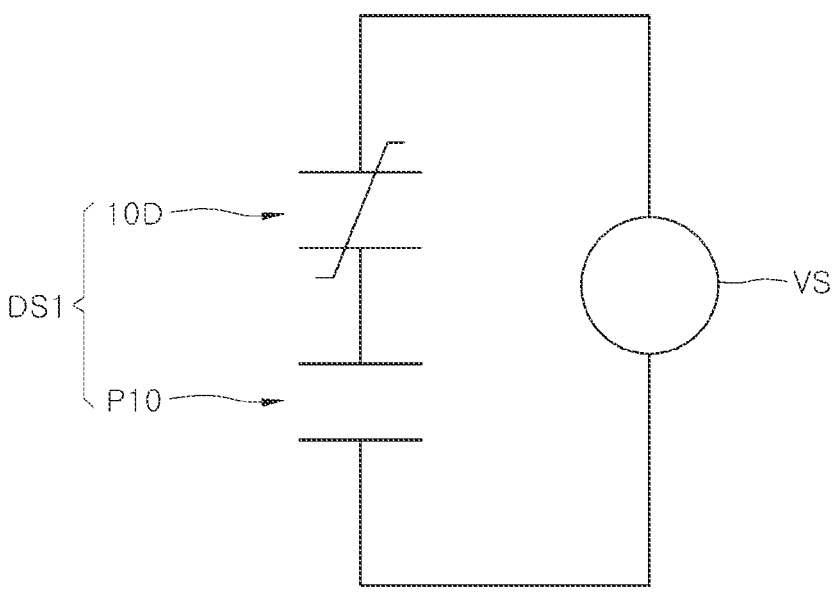
FIG. 4 is a circuit diagram schematically illustrating electrical characteristics of a dielectric structure according to an embodiment of the present disclosure.

FIG. 4 is a circuit diagram schematically illustrating the electrical characteristics of a dielectric structure according to an embodiment of the present disclosure. Referring to FIG. 4, a dielectric structure DS1 having both ends connected to a power supply VS may be provided. The dielectric structure DS1 may include a ferroelectric layer 10D and a dielectric layer P10. The ferroelectric layer 10D and the dielectric layer P10 may have a predetermined thickness ratio. By thickness ratio we refer to the thickness of the ferroelectric layer over the thickness of the dielectric layer. The ferroelectric layer 10D and the dielectric layer P10 may be bonding to each other to be electrically connected in series to each other. By bonding the ferroelectric layer 10D with the dielectric layer P10 in the manner described above with reference to FIG. 1, the ferroelectric layer 10D may have the polarization characteristics of FIG. 1. The dielectric structure DS1 may have non-ferroelectricity.

Meanwhile, when a voltage is applied to both ends of the dielectric structure DS1 by the power supply VS, the capacitance $C_{DS1}$ of the dielectric structure DS1 may be calculated by Equation (4) below.

$$1/(C_{DS1}) = 1/(C_{10D}) + 1/(C_{P10}) \qquad (4)$$

Here, $C_{10D}$ may be a capacitance of the ferroelectric layer 10D, and $C_{P10}$ may be a capacitance of the dielectric layer P10.

Accordingly, the capacitance $C_{DS1}$ of the dielectric structure DS1 may satisfy the condition of the following Equation (5) derived from the Equation (4).

$$C_{DS1} = (C_{10D} * C_{P10})/(C_{10D} + C_{P10}) \qquad (5)$$

According to Equation (5), as described above with reference to FIG. 1, when an absolute value of the capacitance of the ferroelectric layer 10D is greater than an absolute value of the capacitance of the dielectric layer P10 and the ferroelectric layer 10D exhibits a negative capacitance, the capacitance of the dielectric structure DS1 may be greater than at least the capacitance of the dielectric layer P10 in a predetermined range of the applied electric field. In addition, as a difference between the absolute value of the capacitance of the ferroelectric layer 10D and the absolute value of the capacitance of the dielectric layer P10 decreases, the capacitance $C_{DS1}$ of the dielectric structure DS1 may increase.

According to an embodiment of the present disclosure, the ferroelectric layer 10D having a negative capacitance and the non-ferroelectric dielectric layer P10 are connected in series with each other by bonding, thereby providing the dielectric structure DS1 having the capacitance increased than at least the capacitance of the dielectric layer P10.

Figure 5:
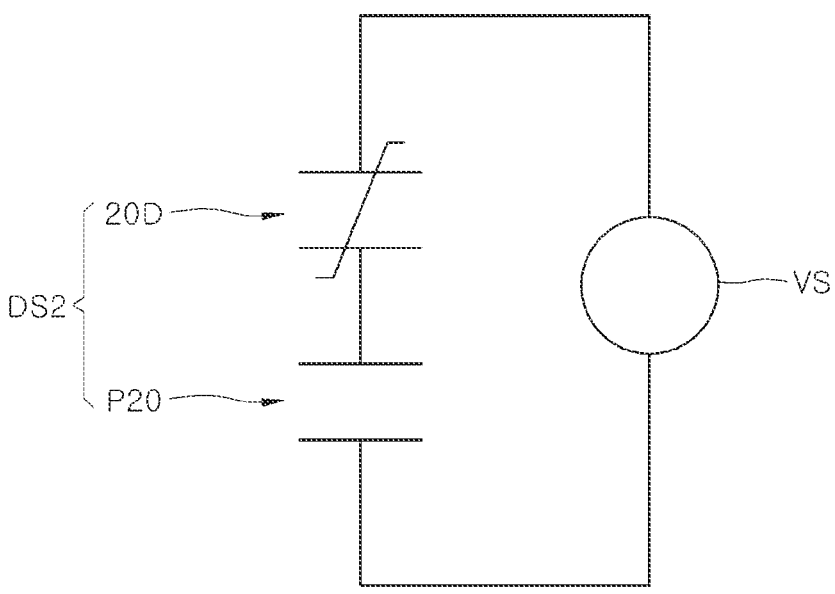
FIG. 5 is a circuit diagram schematically illustrating electrical characteristics of a dielectric structure according to another embodiment of the present disclosure.

FIG. 5 is a circuit diagram schematically illustrating electrical characteristics of a dielectric structure according to another embodiment of the present disclosure. Referring to FIG. 5, a dielectric structure DS2 having both ends connected to a power supply VS may be provided. The dielectric structure DS2 may include a ferroelectric layer 20D and a dielectric layer P20. The ferroelectric layer 20D and the dielectric layer P20 may have a predetermined thickness ratio. The ferroelectric layer 20D and the dielectric layer P20 may be bonded to be electrically connected in series to each other. The ferroelectric layer 20D is bonded to the dielectric layer P20 under the predetermined conditions described above with reference to FIG. 2, so that the ferroelectric layer 20D may have the polarization characteristics of FIG. 2. The dielectric structure DS2 may have non-ferroelectricity.

Meanwhile, when a voltage is applied to both ends of the dielectric structure DS2 by the power supply VS, a capacitance CDS2 of the dielectric structure DS2 may be calculated by Equation (6) below.

$$1/(C_{DS2})=1/(C_{20D})+1/(C_{P20}) \qquad (6)$$

Here, $C_{20D}$ may be a capacitance of the ferroelectric layer 20D, and $C_{P20}o$ may be a capacitance of the dielectric layer P20.

As described above, when the ferroelectric layer 20D has a sufficiently large absolute capacitance compared to the dielectric layer P20, $1/(C_{20D})$ may be neglected in the calculation of Equation (6). For example, a case in which the ferroelectric layer 20D has a sufficiently large absolute capacitance compared to the dielectric layer P20 may refer to a case in which an absolute value of the capacitance of the ferroelectric layer 20D is twice an absolute value of the capacitance of the dielectric layer P20 or more.

The value of $1/(C_{20D})$ is neglected in the calculation of Equation (6), so that the capacitance $C_{DS2}$ of the dielectric structure DS2 may be substantially equal to the capacitance $C_{P20}$ of the dielectric layer P20.

In an embodiment, the dielectric layer P20 may substantially function as a capacitor dielectric layer of the dielectric structure DS2. The ferroelectric layer 20D may be a barrier dielectric layer having a predetermined thickness, and may serve to improve the leakage current characteristics and the breakdown voltage characteristics of the dielectric structure DS2.

Figure 6:
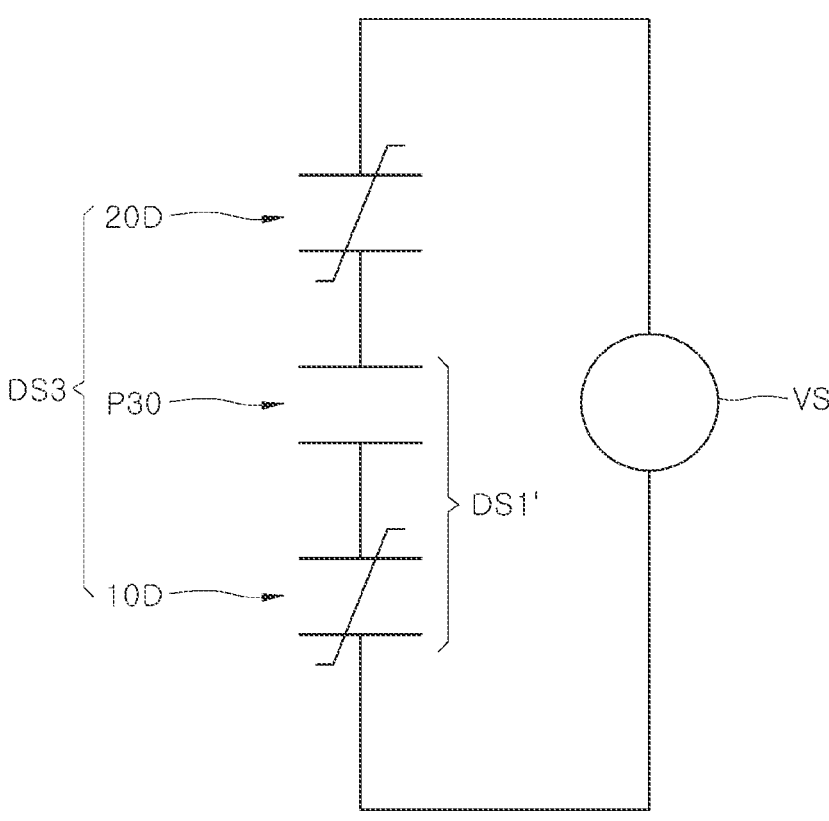
FIG. 6 is a circuit diagram schematically illustrating electrical characteristics of a dielectric structure according to an embodiment of the present disclosure.

FIG. 6 is a circuit diagram schematically illustrating electrical characteristics of a dielectric structure according to an embodiment of the present disclosure. Referring to FIG. 6, a dielectric structure DS3 having both ends connected to a power supply VS may be provided. The dielectric structure DS3 may include a first ferroelectric layer 10D, a dielectric layer P30, and a second ferroelectric layer 20D which are electrically connected in series to each other. The first and second ferroelectric layers 10D and 20D may have ferroelectricity, and the dielectric layer P30 may have non-ferroelectricity.

In an embodiment, the first ferroelectric layer 10D and the dielectric layer P30 may form a sub dielectric structure DS1'. The first ferroelectric layer 10D may be bonded to the dielectric layer P30 in the manner described with reference to FIG. 1, so that the first ferroelectric layer 10D may have the polarization characteristics of FIG. 1. The first ferroelectric layer 10D and the dielectric layer P30 may have a predetermined thickness ratio.

The electrical characteristics of the sub dielectric structure DS1' may be substantially the same as the electrical characteristics of the dielectric structure DS1 described with reference to FIG. 4. For example, when an absolute value of a capacitance of the first ferroelectric layer 10D is greater than an absolute value of a capacitance of the dielectric layer P30, and the first ferroelectric layer 10D has a negative capacitance in an applied electric field of a predetermined range, the sub dielectric structure DS1' may have a capacitance greater than at least the capacitance of the dielectric layer P30 in an applied electric field within a predetermined range. The sub dielectric structure DS1' may have non-ferroelectricity.

Referring to FIG. 6, the sub dielectric structure DS1' and the second ferroelectric layer 20D may be electrically connected in series to each other. The sub dielectric structure DS1' and the second ferroelectric layer 20D may have a predetermined thickness ratio. In an embodiment, the dielectric structure DS3 including the sub dielectric structure DS1' and the second ferroelectric layer 20D may have non-ferroelectricity. In an embodiment, the second ferroelectric layer 20D is bonded to the non-ferroelectric sub dielectric structure DS1' to satisfy the condition described above with reference to FIG. 2, so that the second ferroelectric layer 20D may have the polarization characteristics of FIG. 2. The electrical characteristics of the dielectric structure DS3 may be substantially the same as the electrical characteristics of the dielectric structure DS2 described above with reference to FIG. 5. That is, the sub dielectric structure DS1' may substantially function as a capacitor dielectric layer of the dielectric structure DS3. The second ferroelectric layer 20D may be a barrier layer having a predetermined thickness and may function to improve the leakage current characteristics and the breakdown voltage characteristics of the dielectric structure DS3.

As a result, in an embodiment, the dielectric structure DS3 of FIG. 6 may have an increased capacitance than at least the capacitance of the dielectric layer P30 through the sub dielectric structure DS1', and may have improved leakage current characteristics and the breakdown voltage characteristics through the second ferroelectric layer 20D.

Figure 7:
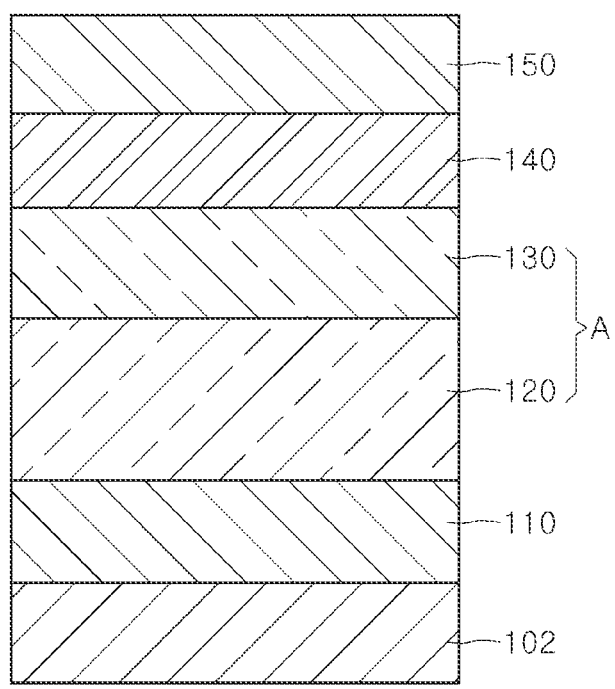
FIG. 7 is a cross-sectional view schematically illustrating a semiconductor device according to an embodiment of the present disclosure.

FIG. 7 is a cross-sectional view schematically illustrating a semiconductor device 1 according to an embodiment of the present disclosure. Referring to FIG. 7, the semiconductor device 1 may include a substrate 102, a first electrode 110 and a second electrode 150 that are spaced apart from each other over the substrate 102. In the illustrated embodiment the first electrode 110 may be disposed on the substrate. The semiconductor device 1 may further include a capacitor dielectric structure A and a barrier dielectric layer 140 that are disposed between the first electrode 110 and the second electrode 150. The capacitor dielectric structure A may include a ferroelectric layer 120 and a dielectric layer 130. In an embodiment, the semiconductor device 1 may be a capacitor device.

The substrate 102 may include, for example, at least one of a semiconductor, conductor, and insulator. The substrate 102 may support the semiconductor device 1. In an embodiment, the substrate 102 may include an integrated circuit. In an embodiment, at least one insulation layer may be disposed between the substrate 102 and the first electrode 110. The at least one insulation layer may electrically insulate the substrate 102 and the first electrode 110. At least one circuit pattern layer may be disposed between the substrate 102 and the first electrode 110. The at least one circuit pattern layer may electrically connect the integrated circuit of the substrate 102 to the first electrode 110.

The first electrode 110 may include a conductive material. The conductive material may include, for example, doped silicon (Si), gold (Au), silver (Ag), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The capacitor dielectric structure A may be disposed on the first electrode 110. The capacitor dielectric structure A may include the ferroelectric layer 120 disposed on the first electrode 110 and the dielectric layer 130 disposed on the ferroelectric layer 120.

The capacitor dielectric structure A may have non-ferroelectricity. For example, the capacitor dielectric structure A may have paraelectricity. In an embodiment, the ferroelectric layer 120 and the dielectric layer 130 may contact each other. The ferroelectric layer 120 and the dielectric layer 130 may have the polarization characteristics of the ferroelectric layer 10D and the dielectric layer 30D described above with reference to FIGS. 1 and 3, respectively.

The ferroelectric layer 120 may include a ferroelectric material. The ferroelectric material may include, for example, hafnium zirconium oxide. In an embodiment, the ferroelectric layer 120 may further include a dopant doped into the ferroelectric material. The dopant may serve to maintain in a more stable manner the ferroelectric characteristics of the ferroelectric layer 120. For example, the dopant may include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Gd), lanthanum (La), or a combination of two or more thereof.

In an embodiment, the ferroelectric layer 120 may have a crystal structure of the orthorhombic crystal system. The ferroelectric layer 120 may have a thickness of 1 nm to 5 nm, for example. The ferroelectric layer 120 may have a single crystalline structure or a polycrystalline structure. In an embodiment, the ferroelectric layer 120 may be an epi-growth layer. The ferroelectric layer 120 may be epitaxially formed on the first electrode 110 through, for example, atomic layer deposition, pulsed layer deposition, or chemical vapor deposition.

Referring to FIG. 7, the dielectric layer 130 may be disposed on the ferroelectric layer 120. The dielectric layer 130 may have non-ferroelectricity of the dielectric layer D30 described above with reference to FIG. 3. The dielectric layer 130 may have paraelectricity, for example. The dielectric layer 130 may have a thickness of 1 nm to 5 nm, for example.

In an embodiment, the dielectric layer 130 may be an epi-growth layer. The dielectric layer 130 may be epitaxially formed on the ferroelectric layer 120 through, for example, atomic layer deposition, pulsed layer deposition, or chemical vapor deposition.

The dielectric layer 130 may include a non-ferroelectric material. For example, the non-ferroelectric material may be a paraelectric material. In an embodiment, the dielectric layer 130 may include aluminum oxide, yttrium oxide, hafnium oxide, zirconium oxide, hafnium zirconium oxide, or a combination thereof. The dielectric layer 130 may include substantially the same material as the ferroelectric layer 120, but may have different crystal structure from the ferroelectric layer 120. For example, the ferroelectric layer 120 may have a crystal structure of the orthorhombic crystal system, and the dielectric layer 130 may have a crystal structure of the tetragonal crystal system.

In an embodiment, the ferroelectric layer 120 and the dielectric layer 130 may be disposed to contact each other. The ferroelectric layer 120 and the dielectric layer 130 may be electrically connected in series to each other between the first electrode 110 and the second electrode 150. In an embodiment, the capacitor dielectric structure A may have substantially the same electrical characteristics as the sub dielectric structure DS1' described in the circuit diagram of FIG. 6. The ferroelectric layer 120 and the dielectric layer 130 of the capacitor dielectric structure A may correspond to the first ferroelectric layer 10D and the dielectric layer P30 of the sub dielectric structure DS1' in the circuit diagram of FIG. 6. Accordingly, when an absolute value of a capacitance of the ferroelectric layer 120 is greater than an absolute value of a capacitance of the dielectric layer 130 and the ferroelectric layer 120 has a negative capacitance in an applied electric field within a predetermined range, the capacitor dielectric structure A may have a capacitance that is greater than at least the capacitance of the dielectric layer 130.

Referring to FIG. 7 again, the barrier dielectric layer 140 may be disposed on the capacitor dielectric structure A. In an embodiment, the barrier dielectric layer 140 may be disposed on the dielectric layer 130 of the capacitor dielectric structure A.

The barrier dielectric layer 140 may include a ferroelectric material. The ferroelectric material may include, for example, hafnium zirconium oxide. In an embodiment, the barrier dielectric layer 140 may further include a dopant doped into the ferroelectric material. The dopant may stably maintain the ferroelectric characteristics of the barrier dielectric layer 140. For example, the dopant may include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Gd), lanthanum (La), or a combination of two or more thereof. In an embodiment, the barrier dielectric layer 140 may include substantially the same material as the ferroelectric layer 120 and the dielectric layer 130. The barrier dielectric layer 140 may have the same crystal structure as the ferroelectric layer 120, and may have a different crystal structure from the dielectric layer 130.

In an embodiment, the barrier dielectric layer 140 may include a crystal structure of the orthorhombic crystal system. The barrier dielectric layer 140 may include a single crystalline structure or a polycrystalline structure. In an embodiment, the barrier dielectric layer 140 may be an epi-growth layer. The barrier dielectric layer 140 may be epitaxially formed on the dielectric layer 130 through, for example, through at least one of an atomic layer deposition, pulsed layer deposition, and chemical vapor deposition.

In an embodiment, the barrier dielectric layer 140 may be disposed to contact the capacitor dielectric structure A. As illustrated in FIG. 7, the barrier dielectric layer 140 may be disposed to contact the dielectric layer 130 of the capacitor dielectric structure A. The capacitor dielectric structure A and the barrier dielectric layer 140 may have a predetermined thickness ratio.

In an embodiment, the capacitor dielectric structure A and the barrier dielectric layer 140 may be electrically connected in series to each other between the first electrode 110 and the second electrode 150. In an embodiment, the capacitor dielectric structure A and the barrier dielectric layer 140 may be disposed to have the same electrical characteristics as the sub dielectric structure DS1' and the second ferroelectric layer 20D described in the circuit diagram of FIG. 6, respectively.

In an embodiment, an absolute value of a capacitance of the barrier dielectric layer 140 may be greater than an absolute value of a capacitance of the capacitor dielectric structure A. For example, the absolute value of the capacitance of the barrier dielectric layer 140 may be 2 to 10 times the absolute value of the capacitance of the capacitor dielectric structure A. As another example, the absolute value of the capacitance of the barrier dielectric layer 140 may be greater than 10 times the absolute value of the capacitance of the capacitor dielectric structure A. In an embodiment, a thickness of the barrier dielectric layer 140 may be smaller than a thickness of the capacitor dielectric structure A. For example, the barrier dielectric layer 140 may have a thickness of 1 nm to 5 nm. As a result, the barrier dielectric layer 140 may have a negative capacitance within a predetermined range of an externally applied electric field.

In an embodiment, when the barrier dielectric layer 140 and the ferroelectric layer 120 include substantially the same material, the thickness of the barrier dielectric layer 140 may be less than the thickness of the ferroelectric layer 120. In an embodiment, the absolute value of the capacitance of the barrier dielectric layer 140 may be greater than the absolute value of the capacitance of the ferroelectric layer 120.

In an embodiment, a capacitance of the structure in which the capacitor dielectric structure A and the barrier dielectric layer 140 are connected in series between the first electrode 110 and the second electrode 150 may be substantially the same as the capacitance of the capacitor dielectric structure A. That is, the capacitor dielectric structure A may substantially function as a capacitor element of the semiconductor device 1. The barrier dielectric layer 140 may be a barrier layer having a predetermined thickness and may function to improve the leakage current characteristics and the breakdown voltage characteristics of the semiconductor device 1.

Referring to FIG. 7 again, the second electrode 150 may be disposed on the barrier dielectric layer 140. The second electrode 150 may include a conductive material. The conductive material may include, for example, doped silicon (Si), gold (Au), silver (Ag), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

As described above, the semiconductor device 1 according to an embodiment of the present disclosure may include the capacitor dielectric structure A and the barrier dielectric layer 140 that are disposed between the first electrode 110 and the second electrode 150. As shown in FIG. 7, the ferroelectric layer 120 may be disposed to contact one surface of the dielectric layer, and the barrier dielectric layer 140 may be disposed to contact another surface of the dielectric layer 130. In an embodiment, the capacitor dielectric structure A may substantially determine the capacitance of the semiconductor device 1. In addition, the barrier dielectric layer 140 may prevent leakage current and increase a breakdown voltage of the semiconductor device 1.

Figure 8:
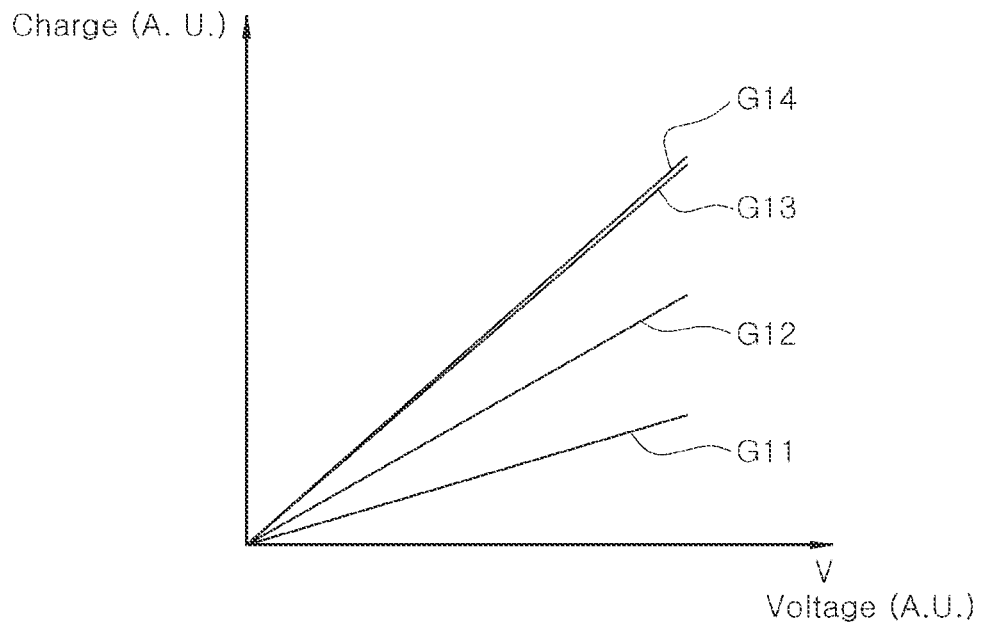
FIG. 8 is a graph schematically illustrating a result of simulating the amount of charge of semiconductor devices depending on applied voltages in an embodiment of the present disclosure.

FIG. 8 illustrates graphs schematically illustrating a result of simulating charge amounts of semiconductor devices depending on applied voltages. First to fourth graphs G11, G12, G13, and G14 of FIG. 8 provide of the charging characteristics of first to fourth semiconductor devices having first to fourth different dielectric structures, respectively. In the first to fourth graphs G11, G12, G13, and G14, the charge amount changes $\Delta Q$ depending on the voltage change $\Delta V$, that is, the slopes of the first to fourth graphs G11, G12, G13, and G14 may correspond to capacitances of the first to fourth dielectric structures, respectively. The first to third graphs G11, G12, and G13 may represent charging characteristics of the first to third semiconductor devices that are comparative examples of the present disclosure, and the fourth graph G14 may represent charging characteristics of the fourth semiconductor device according to an embodiment of the present disclosure.

The first dielectric structure corresponding the first graph G11 may be a paraelectric structure in which a first zirconium oxide layer, an aluminum oxide layer, and a second zirconium oxide layer are sequentially stacked, and may have a first thickness. Each of the first and second zirconium oxide layers and the aluminum oxide layer may have paraelectricity. The second dielectric structure corresponding the second graph G12 may have a stack structure of the same layers as the first dielectric structure, but may have a second thickness corresponding to 40% of the first thickness of the first dielectric structure. The third dielectric structure corresponding the third graph G13 may have a configuration in which a first ferroelectric layer having a negative capacitance is additionally bonded to an edge portion of the second dielectric structure. The first ferroelectric layer may be a hafnium zirconium oxide layer. The third dielectric structure may have substantially the same electrical characteristics as the dielectric structure DS1 of the circuit diagram of FIG. 4. The fourth dielectric structure corresponding the fourth graph G14 may have a configuration in which a second ferroelectric layer having a negative capacitance is additionally bonded to another edge portion of the second dielectric structure. The second ferroelectric layer may be a hafnium zirconium oxide layer. The fourth dielectric structure may have substantially the same electrical characteristics as the dielectric structure DS3 of the circuit diagram of FIG. 6.

Referring to FIG. 8, the change in an amount of charge $\Delta Q$, that is, the capacitance according to the voltage change $\Delta V$ of the first dielectric structure according to the first graph G11 may be the smallest. The capacitance of the second dielectric structure according to the second graph G12 may be greater than the capacitance of the first dielectric structure due to the reduced thickness. The capacitances of the third and fourth dielectric structures according to the third graph G13 and the fourth graph G14, respectively, may be represented in substantially the same form. The capacitances of the third and fourth dielectric structures may be greater than the capacitance of the second dielectric structure due to the coupling with the first ferroelectric layer having a negative capacitance. In this case, the fourth dielectric structure may have substantially the same capacitance as the third dielectric structure, despite having a greater thickness than the third dielectric structure by a thickness of the second ferroelectric layer.

Figure 9:
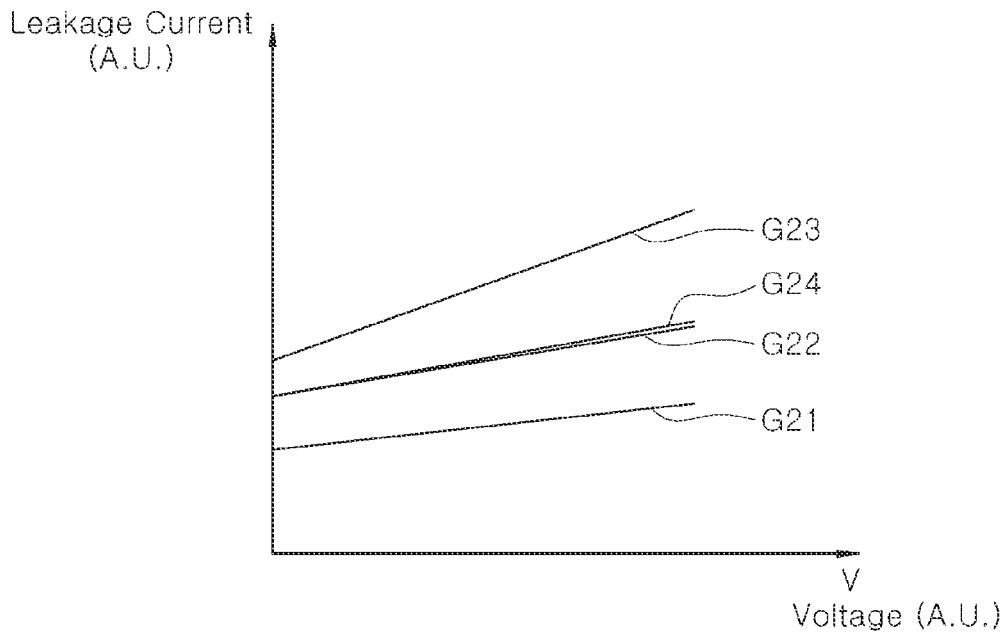
FIG. 9 is a graph schematically illustrating a result of simulating leakage currents of the semiconductor devices of FIG. 8.

FIG. 9 illustrates graphs schematically illustrating a result of simulating leakage currents of the semiconductor devices of FIG. 8. First to fourth graphs G21, G22, G23, and G24 of FIG. 9 may be graphs obtained by calculating leakage currents generated from the first to fourth dielectric structures when voltages are respectively applied to the first to fourth dielectric structures described with reference to FIG. 8.

Referring to FIG. 9, the leakage current of the first dielectric structure according to the first graph G21 may be the lowest. The first dielectric structure may include first and second zirconium oxide layers and an aluminum oxide layer which are paraelectric layers, respectively, and may have a first thickness.

In addition, the leakage current of the second dielectric structure of the second graph G22 may be greater than the leakage current of the first dielectric structure of the first graph G21. The second dielectric structure may have a thickness of 40% of that of the first dielectric structure. Meanwhile, the leakage current of the third dielectric structure according to the third graph G23 may be the highest. The leakage current of the fourth dielectric structure according to the fourth graph G24 may be smaller than the leakage current of the third dielectric structure according to the third graph G23 due to the second ferroelectric layer that functions as a barrier dielectric layer. Referring to FIGS. 8 and 9 together, the fourth dielectric structure according to an embodiment of the present disclosure may have substantially the same capacitance as the third dielectric structure, and may have superior leakage current characteristics than the third dielectric structure.

Figure 10:
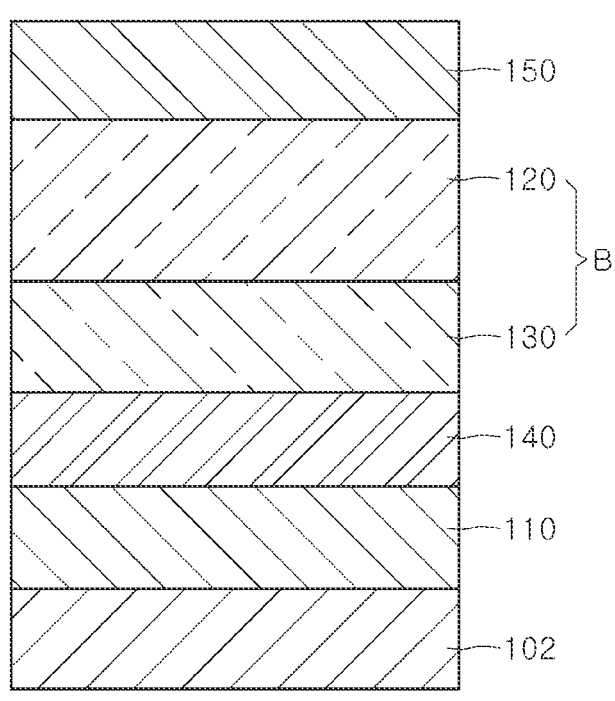
FIG. 10 is a cross-sectional view schematically illustrating a semiconductor device according to another embodiment of the present disclosure.

FIG. 10 is a cross-sectional view schematically illustrating a semiconductor device 2 according to another embodiment of the present disclosure. The semiconductor device 2 may be different from the semiconductor device 1 of FIG. 7 in the arrangement of a barrier dielectric layer 140 and a capacitor dielectric structure B, compared to the semiconductor device 1 of FIG. 7.

Referring to FIG. 10, a first electrode 110 may be disposed on a substrate 102. The barrier dielectric layer 140 may be disposed on the first electrode 110, and the capacitor dielectric structure B may be disposed on a second electrode 150. The capacitor dielectric structure B may include a dielectric layer 130 disposed on the barrier dielectric layer 140, and a ferroelectric layer 120 disposed on the dielectric layer 130.

Referring to FIG. 10, the barrier dielectric layer 140 may be disposed to contact one surface of the dielectric layer 130, and the ferroelectric layer 120 may be disposed to contact the opposite surface of the dielectric layer 130. The capacitor dielectric structure B may have substantially the same electrical characteristics as the capacitor dielectric structure A of FIG. 7. That is, the capacitor dielectric structure B may substantially determine the capacitance of the semiconductor device 2. The barrier dielectric layer 140 may be disposed in contact with the capacitor dielectric structure B to improve the leakage current characteristics and the breakdown voltage characteristics of the semiconductor device 2.

Figure 11:
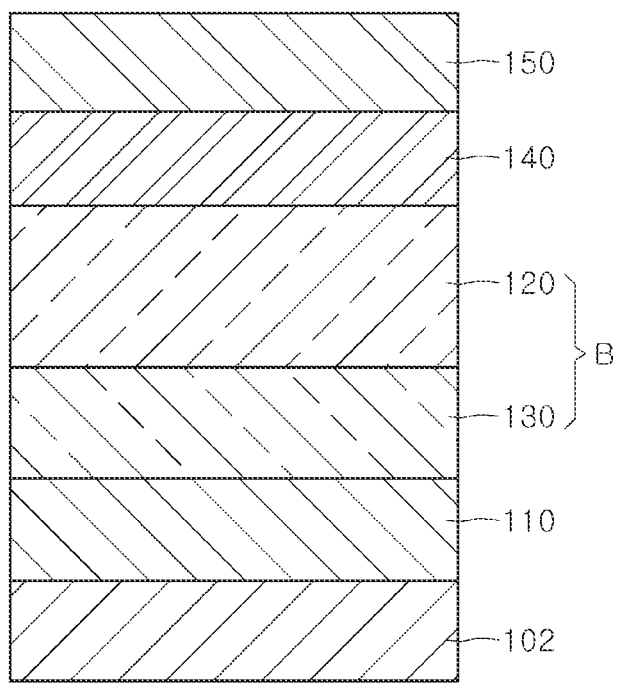
FIG. 11 is a cross-sectional view schematically illustrating a semiconductor device according to an embodiment of the present disclosure.

FIG. 11 is a cross-sectional view schematically illustrating a semiconductor device 3 according to an embodiment of the present disclosure. The semiconductor device 3 of FIG. 11 may be different from the semiconductor device 1 of FIG. 7 in the arrangement of a ferroelectric layer 120 and a dielectric layer 130 of a capacitor dielectric structure B, compared to the semiconductor device 1 of FIG. 7.

Referring to FIG. 11, a first electrode 110 may be disposed on a substrate 102. The capacitor dielectric structure B may be disposed on the first electrode 110, and a barrier dielectric layer 140 may be disposed on the capacitor dielectric structure B. The capacitor dielectric structure B may include the dielectric layer 130 disposed on the first electrode 110, and the ferroelectric layer 120 disposed on the dielectric layer 130.

Referring to FIG. 11, the dielectric layer 130 may be disposed to contact one surface of the ferroelectric layer 120, and the barrier dielectric layer 140 may be disposed to contact the opposite surface of the ferroelectric layer 120. The capacitor dielectric structure B may have substantially the same electrical characteristics as the capacitor dielectric structure A of FIG. 7. The capacitor dielectric structure B may substantially determine a capacitance of the semiconductor device 3. The barrier dielectric layer 140 may be disposed to contact the capacitor dielectric structure B to improve the leakage current characteristics and the breakdown voltage characteristics of the semiconductor device 3.

Figure 12:
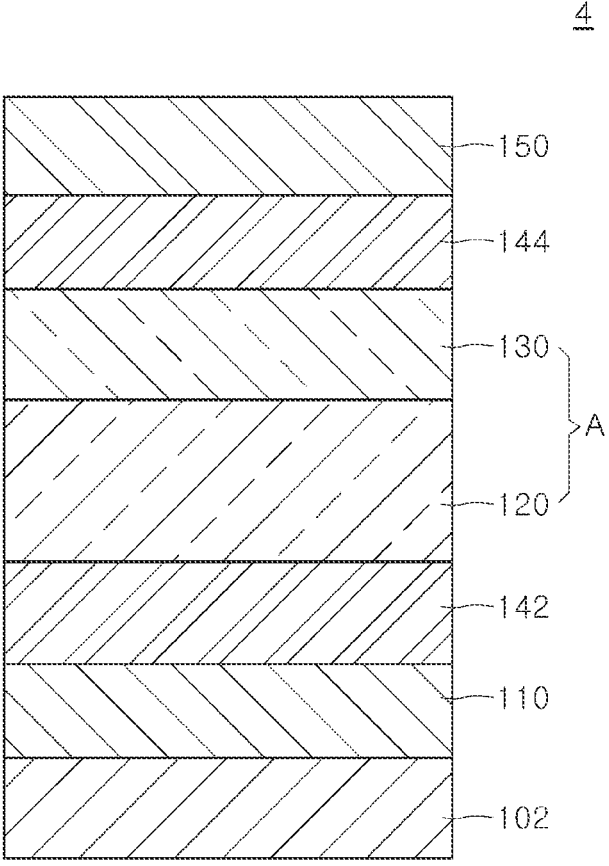
FIG. 12 is a cross-sectional view schematically illustrating a semiconductor device according to an embodiment of the present disclosure.

FIG. 12 is a cross-sectional view schematically illustrating a semiconductor device 4 according to an embodiment of the present disclosure. The semiconductor device 4 of FIG. 12 may be different from the semiconductor device 1 of FIG. 7 in the configuration of the first and second barrier dielectric layers 142 and 144, compared to the semiconductor device 1 of FIG. 7.

Referring to FIG. 12, a first electrode 110 may be disposed on a substrate 102. The first barrier dielectric layer 142 may be disposed on the first electrode 110, and a capacitor dielectric structure A may be disposed on the first barrier dielectric layer 142. The second barrier dielectric layer 144 may be disposed on the capacitor dielectric structure A, and a second electrode 150 may be disposed on the second barrier dielectric layer 144. In an embodiment, the capacitor dielectric structure A may include a ferroelectric layer 120 disposed on the first barrier dielectric layer 142, and a dielectric layer 130 disposed on the ferroelectric layer 120.

Referring to FIG. 12, the first barrier dielectric layer 142 may be disposed to contact one surface of the ferroelectric layer 120, and the dielectric layer 130 may be disposed to contact the opposite surface of the ferroelectric layer 120. In addition, the second barrier dielectric layer 144 may be disposed to contact the other surface of the dielectric layer 130 that is opposite to the surface of the dielectric layer 130 that is in contact with the ferroelectric layer 120. The materials and dielectric characteristics of the first and second barrier dielectric layers 142 and 144 may be substantially the same as those of the barrier dielectric layer 140 of the semiconductor device 1 of FIG. 7. Accordingly, the capacitor dielectric structure A may function as a capacitor element of the semiconductor device 4. The first and second barrier dielectric layers 142 and 144 may be disposed in contact with the capacitor dielectric structure A to improve the leakage current characteristics and the breakdown voltage characteristics of the semiconductor device 4.

Figure 13:
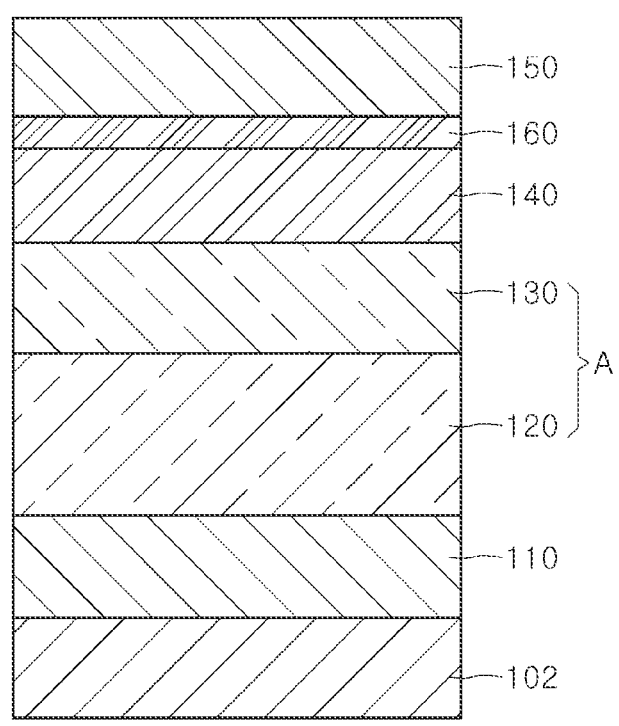
FIG. 13 is a cross-sectional view schematically illustrating a semiconductor device according to an embodiment of the present disclosure.

FIG. 13 is a cross-sectional view schematically illustrating a semiconductor device 5 according to an embodiment of the present disclosure. The semiconductor 5 of FIG. 13 may further include an interfacial insulation layer 160 disposed between the barrier dielectric layer 140 and the second electrode 150, compared to the semiconductor device 1 of FIG. 7.

The interfacial insulation layer 160 may mitigate material exchange between the barrier dielectric layer 140 and the second electrode 150. The interfacial insulation layer 160 may serve to suppress direct reaction between the barrier dielectric layer 140 and the second electrode 150. In an embodiment, the interfacial insulation layer 160 may react with the second electrode 150 in advance to form a compound layer, thereby preventing the barrier dielectric layer 140 from being reduced through the reaction with the second electrode 150. Accordingly, the material composition of the barrier dielectric layer 140 may be stably maintained.

In an embodiment, a band gap energy of the interfacial insulation layer 160 may be greater than a band gap energy of the barrier dielectric layer 140. Accordingly, the interfacial insulation layer 160 may form a potential barrier between the barrier dielectric layer 140 and the second electrode 150. The interfacial insulation layer 160 may reduce or prevent the leakage current generated at an interface between the barrier dielectric layer 140 and the second electrode 150 during operation of the semiconductor device 5, and may increase a breakdown voltage of the semiconductor device 5.

In an embodiment, the interfacial insulation layer 160 may include, for example, at least one of aluminum oxide, yttrium oxide, magnesium oxide, niobium oxide, and titanium oxide. In an embodiment, the interfacial insulation layer 160 may have an amorphous structure.

In some embodiments, an interfacial insulation layer may be additionally disposed between the first electrode 110 and the ferroelectric layer 120. In an embodiment, the interfacial insulation layer may mitigate material exchange between the first electrode 110 and the ferroelectric layer 120 for preventing the material composition of the ferroelectric layer 120 from being changed. In an embodiment, a band gap energy of the interfacial insulation layer may be greater than a band gap energy of the ferroelectric layer 120. Accordingly, the interfacial insulation layer may form a potential barrier between the ferroelectric layer 120 and the first electrode 110. The interface insulation layer may reduce or prevent a leakage current generated at an interface between the ferroelectric layer 120 and the first electrode 110 during operation of the semiconductor device 5, and may increase the breakdown voltage of the semiconductor device 5. In some embodiments, the interfacial insulation layer 160 may not be disposed between the barrier dielectric layer 140 and the second electrode 150, and the interfacial insulation layer may be disposed only between the first electrode 110 and the ferroelectric layer 120.

In some embodiments, the interfacial insulation layer 160 may be disposed between the ferroelectric layer 120 and the second electrode 150 of the semiconductor device 2 of FIG. 10. In some embodiments, the interfacial insulation layer 160 may be disposed between the barrier dielectric layer 140 and the second electrode 150 of the semiconductor device 3 of FIG. 11. In some embodiments, the interfacial insulation layer 160 may be disposed between the dielectric layer 130 and the second electrode 150 of the semiconductor device 4 of FIG. 12.

Figure 14:
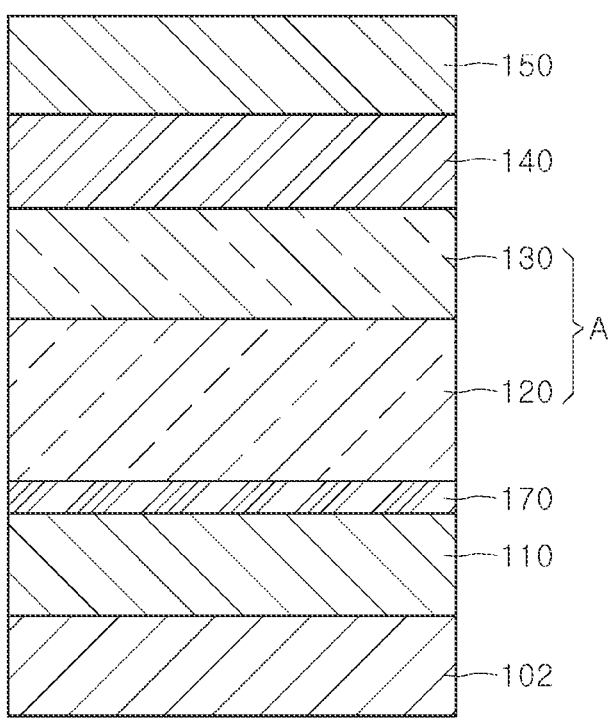
FIG. 14 is a cross-sectional view schematically illustrating a semiconductor device according to an embodiment of the present disclosure.

FIG. 14 is a cross-sectional view schematically illustrating a semiconductor device 6 according to an embodiment of the present disclosure. The semiconductor device 6 of FIG. 14 may further include a crystallization seed layer 170, compared to the semiconductor device 1 described with reference to FIG. 7.

The crystallization seed layer 170 may be disposed between the first electrode 110 and the ferroelectric layer 120. The crystallization seed layer 170 may have a crystalline structure, and may induce the crystallization of the ferroelectric layer 120. In an embodiment, after the ferroelectric layer 120 is formed as an amorphous material layer on the crystallization seed layer 170, the ferroelectric layer 120 may be converted to have a crystalline structure through a crystallization heat treatment using the crystallization seed layer 170. The conversion to the crystalline structure may improve the ferroelectric characteristics of the ferroelectric layer 120. The crystallization seed layer 170 may have non-ferroelectricity.

In addition, the crystallization seed layer 170 may function as a buffer layer capable of reducing a difference in lattice constant between the first electrode 110 and the ferroelectric layer 120. For example, a lattice constant of the crystallization seed layer 170 may be between a lattice constant of the first electrode 110 and a lattice constant of the ferroelectric layer 120. The crystallization seed layer 170 may suppress defects that may occur at an interface where the first electrode 110 and the ferroelectric layer 120 are in direct contact. Accordingly, the crystallization seed layer 170 may reduce or prevent a leakage current that may occur at the interface between the first electrode 110 and the ferroelectric layer 120. The crystallization seed layer 170 may include, for example, magnesium oxide or zirconium oxide.

In some embodiments, the crystallization seed layer 170 may be disposed between the first electrode 110 and the barrier dielectric layer 140 of the semiconductor device 2 of FIG. 10 and the semiconductor device 4 of FIG. 12. In an embodiment, the crystallization seed layer 170 may induce the crystallization of the barrier dielectric layer 140.

Figure 15:
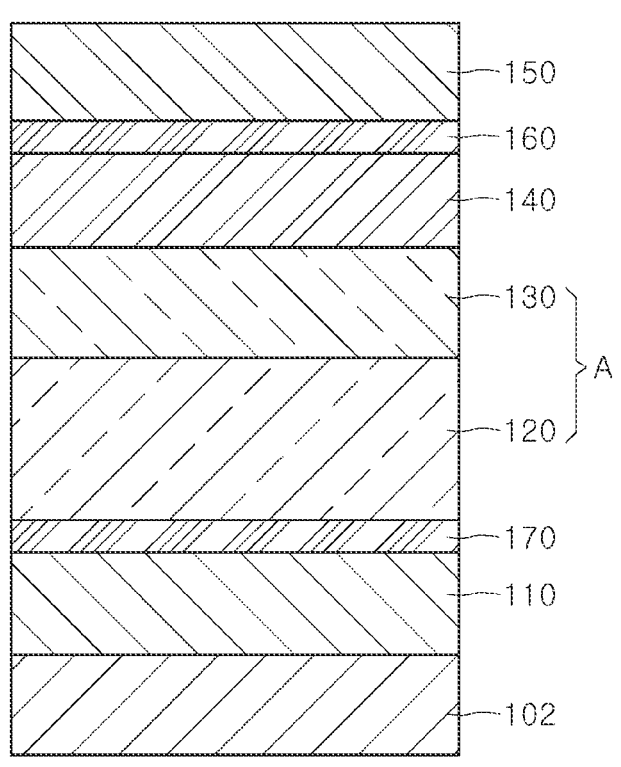
FIG. 15 is a cross-sectional view schematically illustrating a semiconductor device according to an embodiment of the present disclosure.

FIG. 15 is a cross-sectional view schematically illustrating a semiconductor device 7 according to an embodiment of the present disclosure. Referring to FIG. 15, the semiconductor device 7 may further include a crystallization seed layer 170 disposed between a first electrode 110 and a ferroelectric layer 120, and an interfacial insulation layer 160 between a barrier dielectric layer 140 and a second electrode 150, compared to the semiconductor device 1 described with reference to FIG. 7.

Accordingly, in the semiconductor device 7 of FIG. 15, a function of the interfacial insulation layer 160 of the semiconductor device 5 described with reference to FIG. 13 and a function of the crystallization seed layer 170 of the semiconductor device 6 described with reference to FIG. 14 may be performed together. In some embodiments, the interfacial insulation layer 160 and the crystalline seed layer 170 may be applied to the semiconductor device 2 of FIG. and the semiconductor device 4 of FIG. 12.

Figure 16A:
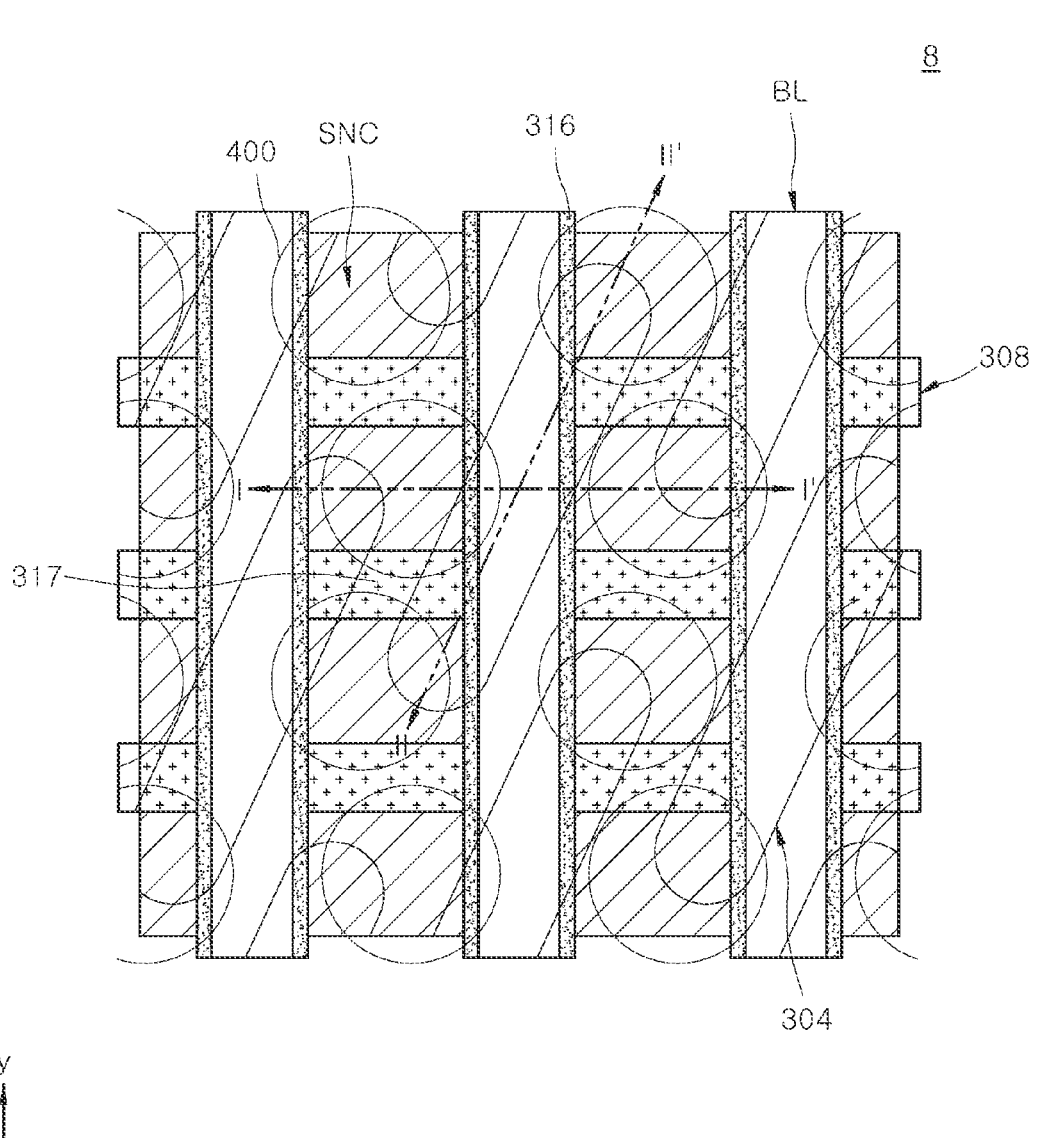
FIG. 16A is a plan view schematically illustrating memory cells of an electronic device according to an embodiment of the present disclosure.
Figure 16B:
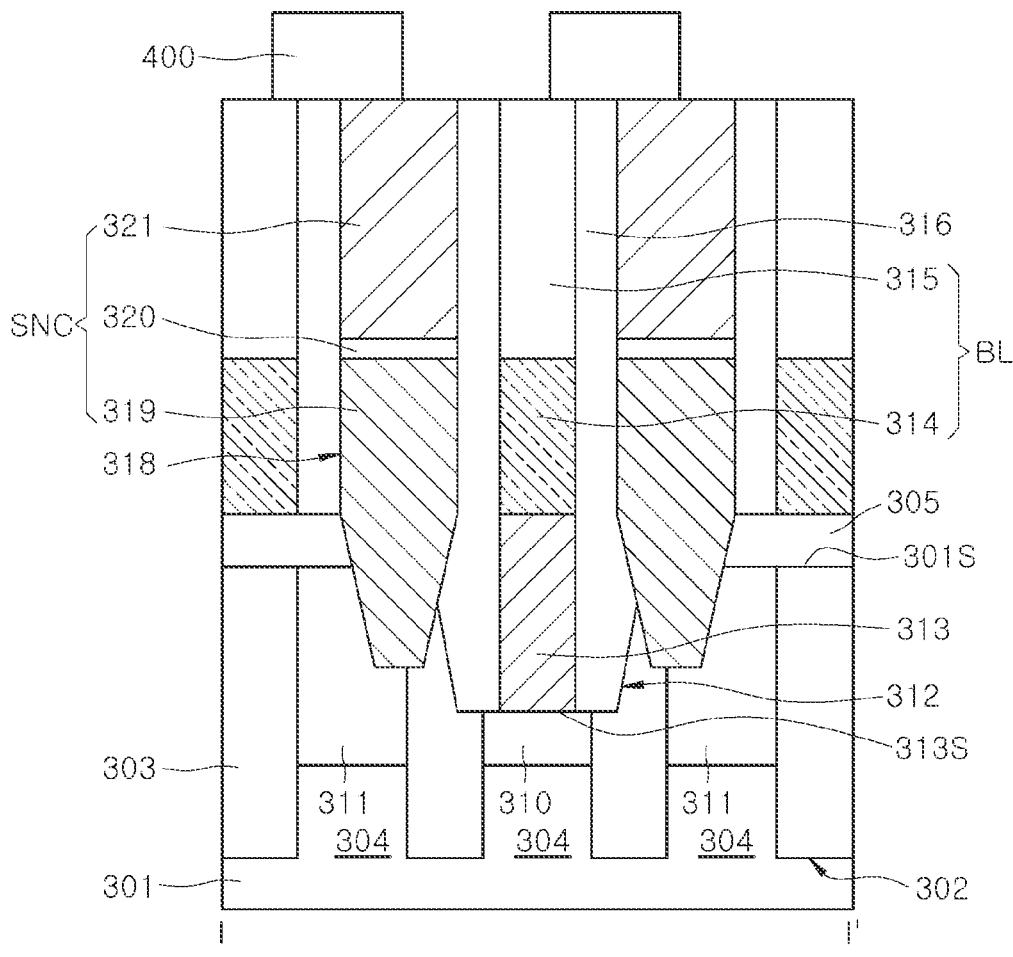
FIG. 16B is a cross-sectional view of the memory cells of FIG. 16A taken along line I-I'.
Figure 16B:
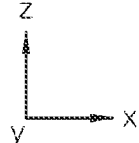
Figure 16C:
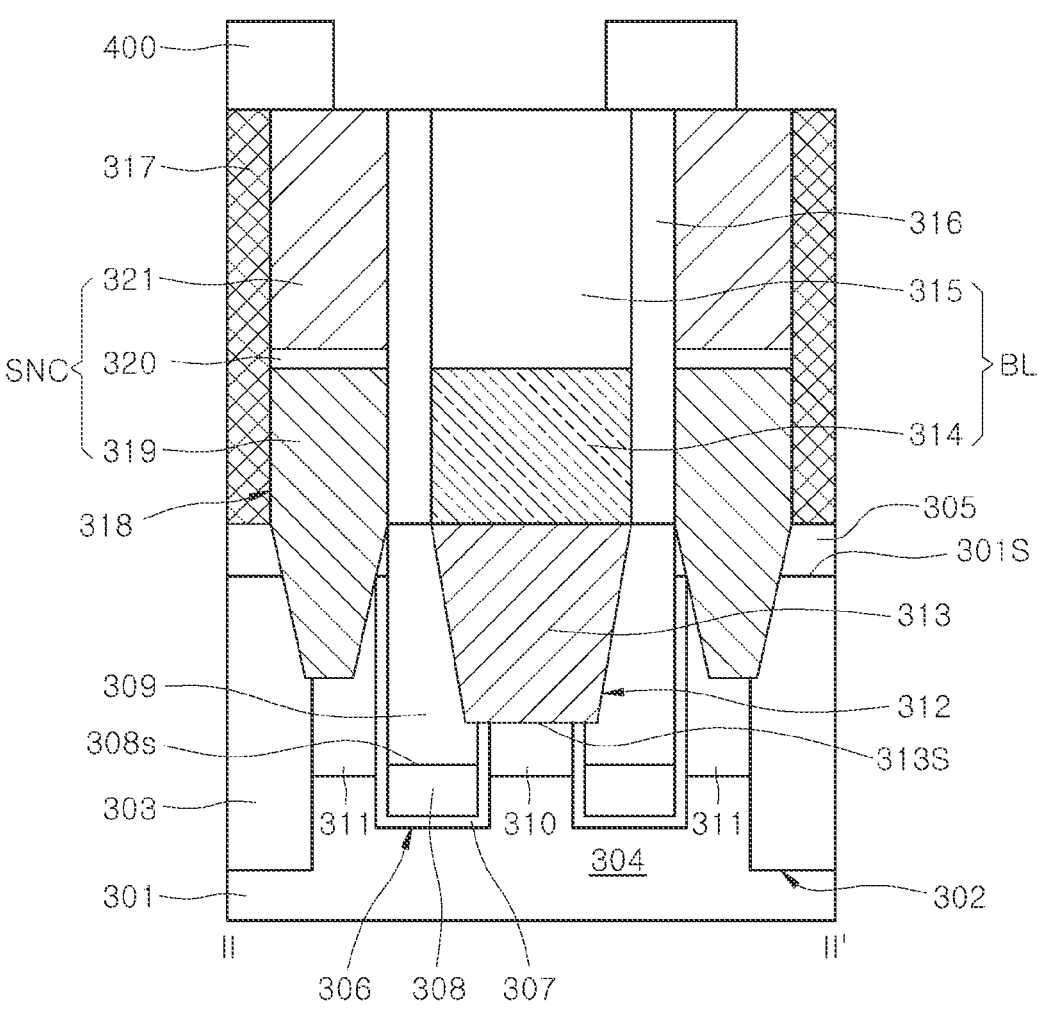
FIG. 16C is a cross-sectional view of the memory cells of FIG. 16A taken along line II-II'.

FIG. 16A is a plan view schematically illustrating memory cells 8 of an electronic device according to an embodiment of the present disclosure. FIG. 16B is a cross-sectional view of the memory cells of FIG. 16A taken along line I-I'. FIG. 16C is a cross-sectional view of the memory cells of FIG. 16A taken along line II-II'.

Referring to FIGS. 16A to 16C, each of the memory cells 8 may include a cell transistor including a buried word line 308, and a cell capacitor 400 electrically connected to the cell transistor.

A substrate 301 may include a semiconductor material. The substrate 301 may include device isolation layers 303 and active regions 304. The active regions 304 may be doped with an n-type or p-type dopant. A cell region of each of the active regions 304 may be doped with a p-type dopant. The active regions 304 may be defined as regions of the substrate 301, distinguished by the device isolation layers 303. The device isolation layers 303 may be formed through a shallow trench isolation (STI) process, and may be disposed inside the device isolation trenches 302 formed in the substrate 301.

Referring to FIG. 16C, word line trenches 306 may be formed in the substrate 301. A gate insulation layer 307 may be disposed on an inner surface of each of the word line trenches 306. Buried word line 308 may be disposed on the gate insulation layer 307 to only partially fill each of the word line trenches 306.

Word line capping layer 309 may be disposed on the buried word line 308 in each of the word line trenches 306. Top surface 308S of the buried word line 308 may be located at a bottom level than a top surface 301S of the substrate 301. In an embodiment, each of the buried word lines 308 may be a thin film structure including a titanium nitride layer and a tungsten layer. In another embodiment, each of the buried word lines 308 may be formed of a single titanium nitride layer or a single tungsten layer.

Referring to FIGS. 16B and 16C, first and second doping regions 310 and 311 may be formed in the active regions 304 of the substrate 301. The first and second doping regions 310 and 311 may be spaced apart from each other by the word line trenches 306. One of the first and second doping regions 310 and 311 may be a source region of the cell transistor, and the other may be a drain region of the cell transistor. The first and second doping regions 310 and 311 may include an n-type dopant such as arsenide (As) or phosphorus (P).

As described above, the buried word line 308, and the first and second doping regions 310 and 311 may constitute the cell transistor. The buried word lines 308 may extend in the x-direction of FIG. 16A.

Referring to FIGS. 16B and 16C, a bit line contact plug 313 may be disposed in the substrate 301. The bit line contact plug 313 may be electrically connected to the first doping region 310. The bit line contact plug 313 may be disposed in a bit line contact hole 312. The bit line contact hole 312 may be formed in the substrate 301 and a hard mask layer 305 disposed on the substrate 301. A bottom surface 313S of the bit line contact plug 313 may be located at a level bottom than the top surface 301S of the substrate 301. The bit line contact plug 313 may include a conductive material. A bit line structure BL may be disposed on the bit line contact plug 313. The bit line structure BL may include a bit line 314 in contact with the bit line contact plug 313 and a bit line hard mask 315 disposed on the bit line 314.

Referring to FIGS. 16A to 16C together, the bit line 314 may extend in a direction (e.g., y-direction) that intersects the buried word line 308. The bit line 314 may be electrically connected to the first doped region 310 through the bit line contact plug 313. The bit line 314 may include a conductive material. The bit line hard mask 315 may include an insulating material.

Bit line spacers 316 may be formed on the side walls of the bit line structure BL. The bit line spacers 316 may extend to cover both sidewalls of the bit line contact plug 313. The bit line spacer 316 may include silicon oxide, silicon nitride, or a combination thereof. In an embodiment, the bit line spacer 316 may include an air gap. For example, the bit line spacer 316 may have a nitride-air gap-nitride (NAN) structure in which an air gap is positioned between silicon nitrides.

Storage node contact plugs (SNCs) may be disposed to be spaced apart from the bit line structure BL. The storage node contact plugs (SNCs) may be respectively disposed in storage node contact holes 318. Each of the storage node contact plugs (SNCs) may be electrically connected to the second doping region 311. In an embodiment, each of the storage node contact plugs (SNCs) may include a bottom plug 319 and a top plug 321. Each of the storage node contact plugs (SNCs) may further include an ohmic contact layer 320 between the bottom plug 319 and the top plug 321. In an embodiment, the top plug 321 may include metal, the bottom plug 319 may include doped silicon, and the ohmic contact layer 320 may include metal silicide.

Referring to FIG. 16C, a plug isolation layer 317 may be disposed on the hard mask layer 305. The plug isolation layer 317 may be an insulation layer that is formed adjacent to the bit line structure BL. The storage node contact holes 318 may be formed on the active region 304 through the plug isolation layer 317 and the hard mask layer 305.

Referring to FIGS. 16A to 16C, cell capacitors 400 may be respectively disposed on the storage node contact plugs (SNCs). Each of the cell capacitors 400 may have substantially the same configuration as one of the semiconductor device 1 of FIG. 7, the semiconductor device 2 of FIG. 10, the semiconductor device 3 of FIG. 11, the semiconductor device 4 of FIG. 12, the semiconductor device of FIG. 13, the semiconductor device 6 of FIG. 14, and the semiconductor device 7 of FIG. 15. The configuration of the cell capacitor 400 will be described in more detail using the embodiments of FIGS. 17 to 22 below.

As described above, each of the memory cells 8 of FIGS. 16A to 16C has the buried word line 308, but the spirit of the present disclosure is not necessarily limited thereto. In some embodiments, the memory cells 8 may have various types of word lines, such as a planar word line, a recessed word line, and a fin-type word line.

Figure 17:
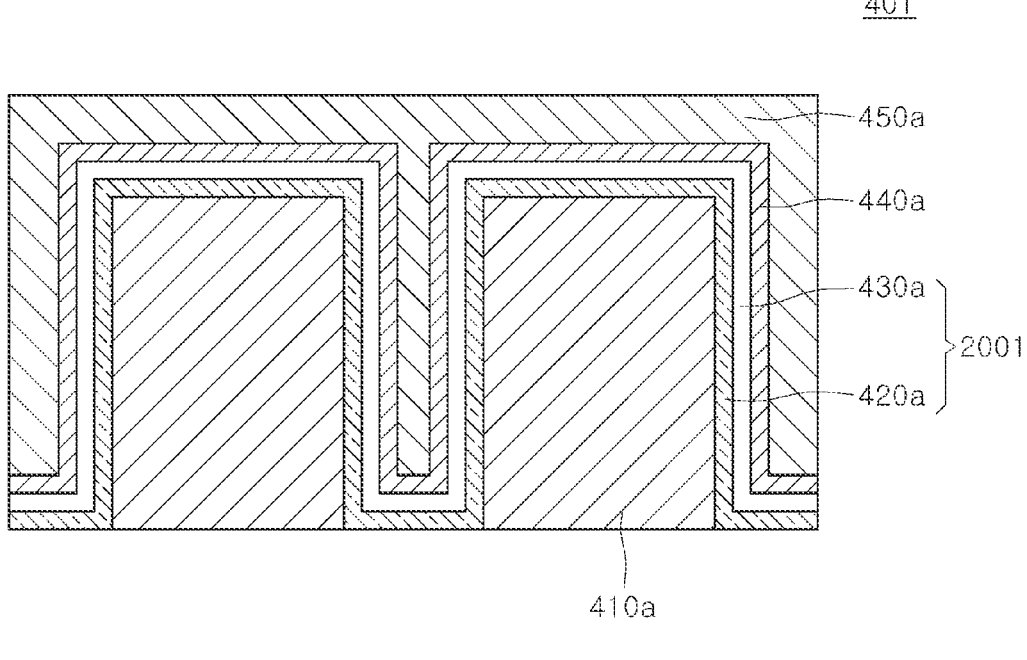
FIG. 17 is a cross-sectional view schematically illustrating a semiconductor device of a three-dimensional structure according to an embodiment of the present disclosure.
Figure 17:
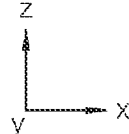

FIG. 17 is a cross-sectional view schematically illustrating a semiconductor device 401 of a three-dimensional structure according to an embodiment of the present disclosure. The semiconductor device 401 of FIG. 17 may include a capacitor element. For example, the semiconductor device 401 may be applied to the cell capacitor 400 of the memory cell 8 of FIGS. 16A to 16C.

Referring to FIG. 17, the semiconductor device 401 may include a pillar-shaped storage node electrode 410a, a capacitor dielectric structure 2001 disposed on the storage node electrode 410a, a barrier dielectric layer 440a disposed on the capacitor dielectric structure 2001, and a plate electrode 450a disposed on the barrier dielectric layer 440a. The capacitor dielectric structure 2001 may include a ferroelectric layer 420a and a dielectric layer 430a. In the semiconductor device 401, the storage node electrode 410a may be an electrode to which an operating voltage is applied, and the plate electrode 440a may be a ground electrode.

In an embodiment, the storage node electrode 410a may be disposed on the storage node contact plug (SNC) of the memory cell 8 described above with reference to FIGS. 16A to 16C. The storage node electrode 410a may be electrically connected to the second doping region 311 of the substrate 301 through the storage node contact plug (SNC).

Referring to FIG. 17, the storage node electrode 410a may include a pillar-shaped conductive structure. The ferroelectric layer 420a may be disposed to cover the storage node electrode 410a. The dielectric layer 430a may be disposed to cover the ferroelectric layer 420a. The barrier dielectric layer 440a may be disposed to cover the dielectric layer 430a. The plate electrode 450a may be disposed to cover the barrier dielectric layer 440a.

In an embodiment, the semiconductor device 401 may have substantially the same configuration as the semiconductor device 1 described with reference to FIG. 7. For example, the storage node electrode 410a, the capacitor dielectric structure 2001, the barrier dielectric layer 440a, and the plate electrode 450a of the semiconductor device 401 may correspond to the first electrode 110, the capacitor dielectric structure A, the barrier dielectric layer 140, and the second electrode 150 of the semiconductor device 1, respectively. In an embodiment, the properties and functions of the storage node electrode 410a, the capacitor dielectric structure 2001, the barrier dielectric layer 440a, and the plate electrode 450a of the semiconductor device 401 may be substantially the same as the properties and functions of the first electrode 110, the capacitor dielectric structure A, the barrier dielectric layer 140, and the second electrode 150 of the semiconductor device 1, respectively.

In an embodiment, the capacitor dielectric structure 2001 may have non-ferroelectricity. In the capacitor dielectric structure 2001, the ferroelectric layer 420a and the dielectric layer 430a may be electrically connected in series to each other between the storage node electrode 410a and the plate electrode 450a. In an embodiment, an absolute value of a capacitance of the ferroelectric layer 420a may be greater than an absolute value of a capacitance of the dielectric layer 430a, and the ferroelectric layer 420a may have a negative capacitance in a predetermined range of an applied electric field. In this case, the capacitor dielectric structure 2001 may have a capacitance greater than at least the capacitance of the dielectric layer 430a.

In an embodiment, an absolute value of a capacitance of the barrier dielectric layer 440a may be greater than an absolute value of the capacitance of the capacitor dielectric structure 2001. For example, the absolute value of the capacitance of the barrier dielectric layer 440a may be 2 to 10 times the absolute value of the capacitance of the capacitor dielectric structure 2001. As another example, the absolute value of the capacitance of the barrier dielectric layer 440a may be greater than 10 times the absolute value of the capacitance of the capacitor dielectric structure 2001. In an embodiment, a thickness of the barrier dielectric layer 440a may be less than a thickness of the capacitor dielectric structure 2001. For example, the barrier dielectric layer 440a may have a thickness of 1 nm to 5 nm. The barrier dielectric layer 440a may have a negative capacitance within a predetermined range of an externally applied electric field.

In an embodiment, when the ferroelectric layer 420a and the barrier dielectric layer 440a include substantially the same material, the thickness of the barrier dielectric layer 440a may be smaller than the thickness of the ferroelectric layer 420a. In an embodiment, the absolute value of the capacitance of the barrier dielectric layer 440a may be greater than the absolute value of the capacitance of the ferroelectric layer 420a.

In an embodiment, the capacitance of the semiconductor device 401 in which the capacitor dielectric structure 2001 and the barrier dielectric layer 440a are connected in series to each other between the storage node electrode 410a and the plate electrode 450a may be substantially the same as the capacitance of the capacitor dielectric structure 2001. That is, the capacitor dielectric structure 2001 may substantially function as a capacitor element of the semiconductor device 401. The barrier dielectric layer 440a may be a barrier layer having a predetermined thickness, and may function to improve the leakage current characteristics and the breakdown voltage characteristics of the semiconductor device 401.

In some embodiments, the semiconductor device 401 may further include an interfacial insulation layer disposed between the barrier dielectric layer 440a and the plate electrode 450a. The interfacial insulation layer may correspond to the interfacial insulation layer 160 disposed between the barrier dielectric layer 140 and the second electrode 150 in the semiconductor device 5 described with reference to FIG. 13. The property and function of the interfacial insulation layer may be substantially the same as those of the interfacial insulation layer 160 of the semiconductor device 5.

In some embodiments, the semiconductor device 401 may further include a crystallization seed layer disposed between the storage node electrode 410a and the ferroelectric layer 420a. The crystallization seed layer may correspond to the crystallization seed layer 170 disposed between the first electrode 110 and the ferroelectric layer 120 in the semiconductor device 6 described with reference to FIG. 14. The property and function of the crystallization seed layer may be substantially the same as those of the crystallization seed layer 170 of the semiconductor device 6.

In some embodiments, configurations of the capacitor dielectric structure and the barrier dielectric layer disposed between the storage node electrode 410a and the plate electrode 450a may be modified to correspond to the configurations of the capacitor dielectric structure B and the barrier dielectric layer 140 disposed between the first and second electrodes 110 and 150 of the semiconductor device 2 of FIG. 10, the configurations of the capacitor dielectric structure B and the barrier dielectric layer 140 disposed between the first and second electrodes 110 and 150 of the semiconductor device 3 of FIG. 11, or the configurations of the capacitor dielectric structure B and the barrier dielectric layer 140 disposed between the first and second electrodes 110 and 150 of the semiconductor device 4 of FIG. 12.

Figure 18:
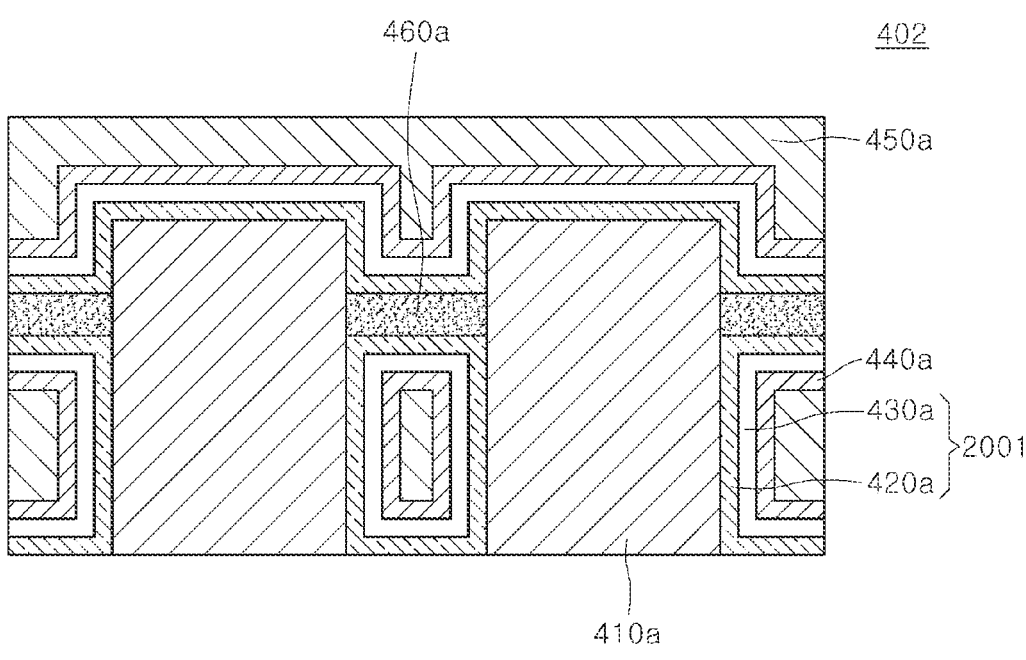
FIG. 18 is a cross-sectional view schematically illustrating a semiconductor device of a three-dimensional structure according to another embodiment of the present disclosure.
Figure 18:
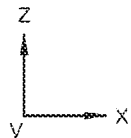

FIG. 18 is a cross-sectional view schematically illustrating a semiconductor device 402 of a three-dimensional structure according to an embodiment of the present disclosure. Referring to FIG. 18, the semiconductor device 402 may further include supporters 460a connecting storage node electrodes 410a to each other, compared to the semiconductor device 401 of FIG. 17. The supporters 460a may serve to physically support outer walls of the storage node electrodes 410a. The supporters 460a may improve structural stability of the storage node electrodes 410a. Each of the supporters 460a may include, for example, silicon nitride.

In an embodiment, in FIG. 18, one supporter 460a is disposed on the outer wall of each of storage node electrodes 410a along a height direction (i.e., the z-direction) of the storage node electrode 410a, but the spirit of the present disclosure is not necessarily limited thereto. In some embodiments, two or more supporters may be disposed on the outer wall of each storage node electrodes 410a along the height direction (i.e., the z-direction) of the storage node electrode 410a.

Figure 19:
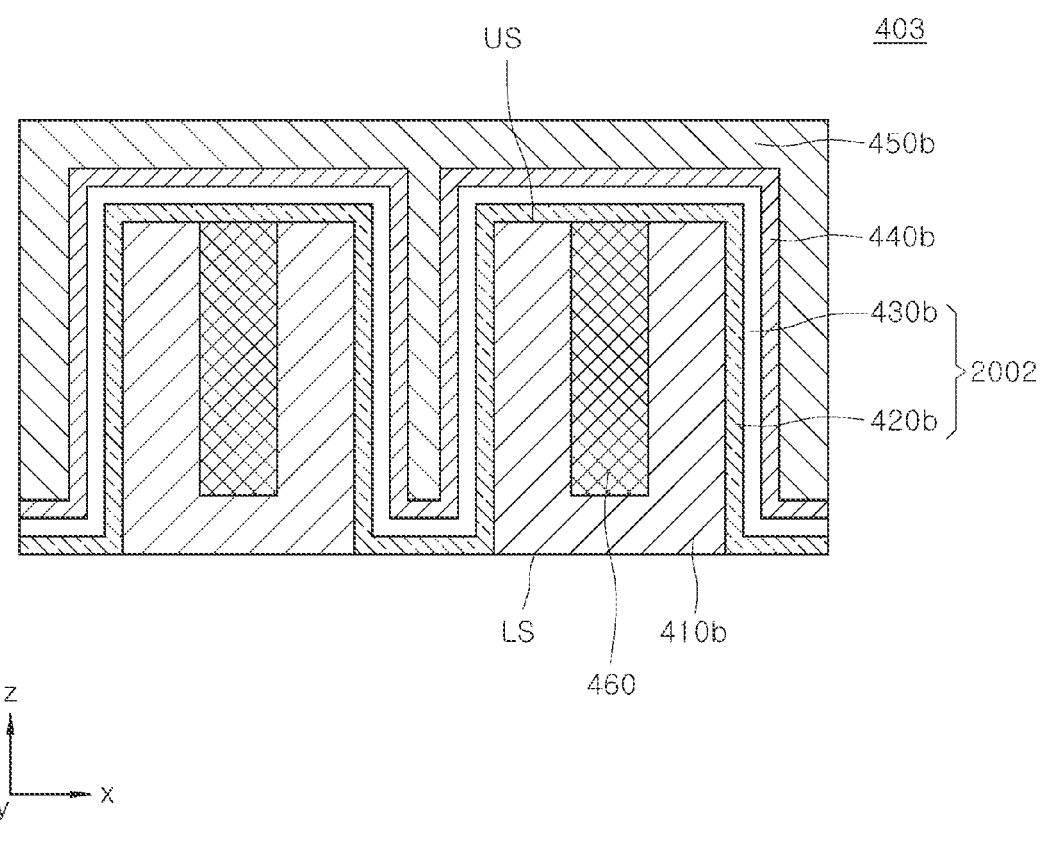
FIG. 19 is a cross-sectional view schematically illustrating a semiconductor device of a three-dimensional structure according to an embodiment of the present disclosure.

FIG. 19 is a cross-sectional view schematically illustrating a semiconductor device 403 of a three-dimensional structure according to an embodiment of the present disclosure. In an embodiment, the semiconductor device 403 may include a capacitor element. For example, the semiconductor device 403 may be applied to the cell capacitor 400 of the memory cell 8 of FIGS. 16A to 16C.

Referring to FIG. 19, the semiconductor device 403 may be different from the semiconductor device 401 described with reference to FIG. 17 in a configuration of a storage node electrode 410b. The configuration of the semiconductor device 403 except for the storage node electrode 410b may be substantially the same as that of the semiconductor device 401.

Referring to FIG. 19, the storage node electrode 410b may include a central pillar structure 460 that fills a trench formed in a pillar-shaped conductive structure. The central pillar structure 460 may be a pillar-shaped structure that has a predetermined cross-sectional area and extends in the z-direction. For example, the central pillar structure 460 may have a cylindrical shape. However, in another example, the central pillar structure 460 may have a polygonal columnar shape.

In an embodiment, the central pillar structure 460 may include a silicon (Si) layer. The silicon (Si) layer may be doped to have conductivity. Alternatively, the silicon (Si) layer may have un-doped state. In an embodiment, in a method of forming the central pillar structure 460, after forming the pillar-shaped conductive structure, trench pattern may be formed in the conductive structure. The trench pattern may extend from the top surface US to the bottom surface LS of the pillar-shaped conductive structure. Subsequently, the trench pattern may be filled with silicon (Si) to form the central pillar structure 460.

Referring to FIG. 19, a capacitor dielectric structure 2002, a barrier dielectric layer 440b, and a plate electrode 450b may be sequentially disposed on the storage node electrode 410b including the central pillar structure 460. A ferroelectric layer 420b of the capacitor dielectric structure 2002 may be disposed on the storage node electrode 410b, and the dielectric layer 430b, the barrier dielectric layer 430b, and the plate electrode 450 may be sequentially disposed on the ferroelectric layer 420b. The configurations of the capacitor dielectric structure 2002, the barrier dielectric layer 440b, and the plate electrode 450b may be substantially the same as the configurations of the capacitor dielectric structure 2001, the barrier dielectric layer 440a, and the plate electrode 450a of the semiconductor device 401 of FIG. 17, respectively.

Figure 20:
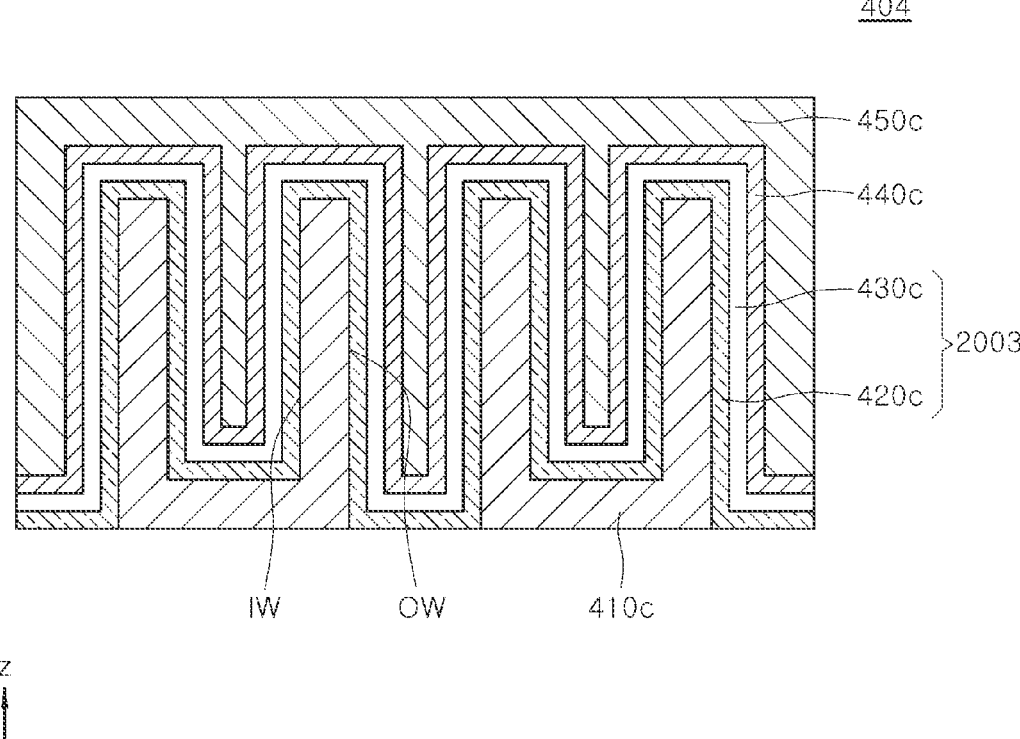
FIG. 20 is a cross-sectional view schematically illustrating a semiconductor device of a three-dimensional structure according to an embodiment of the present disclosure.

FIG. 20 is a cross-sectional view schematically illustrating a semiconductor device 404 of a three-dimensional structure according to an embodiment of the present disclosure. In an embodiment, the semiconductor device 404 may include a capacitor element. For example, the semiconductor device 404 may be applied to the cell capacitor 400 of the memory cell 8 of FIGS. 16A to 16C.

Referring to FIG. 20, the semiconductor device 404 may include a cylindrical-shaped storage node electrode 410c, a capacitor dielectric structure 2003 disposed on the storage node electrode 410c, a barrier dielectric layer 440c disposed on the capacitor dielectric structure 2003, and a plate electrode 450c disposed on the barrier dielectric layer 440c. The capacitor dielectric structure 2003 may include a ferroelectric layer 420c and a dielectric layer 430c that are connected in series to each other. In the semiconductor device 404, the storage node electrode 410c may be an electrode to which an operating voltage is applied, and the plate electrode 450c may be a ground electrode.

The shape of the storage node electrode 410c of the semiconductor device 404 may be different from that of the semiconductor device 401 of FIG. 17. The rest of the configuration of the semiconductor device 404 except for the shape of the storage node electrode 410c may be substantially the same as that of the semiconductor device 401 of FIG. 17. Referring to FIG. 20, the storage node electrode 410c may have a cylindrical shape. Accordingly, the ferroelectric layer 420c of the dielectric structure 2003 may be disposed to cover an inner wall surface IW and an outer wall surface OW of the storage node electrode 410c. The dielectric layer 430c and the barrier dielectric layer 440c may be sequentially disposed on the ferroelectric layer 420c. The plate electrode 450c may be disposed to cover the barrier dielectric layer 440c. The configurations of the capacitor dielectric structure 2003, the barrier dielectric layer 440c, and the plate electrode 450c may be substantially the same as those of the capacitor dielectric structure 2001, the barrier dielectric layer 440a, and the plate electrode 450a of the semiconductor device 401 of FIG. 17, respectively.

Figure 21:
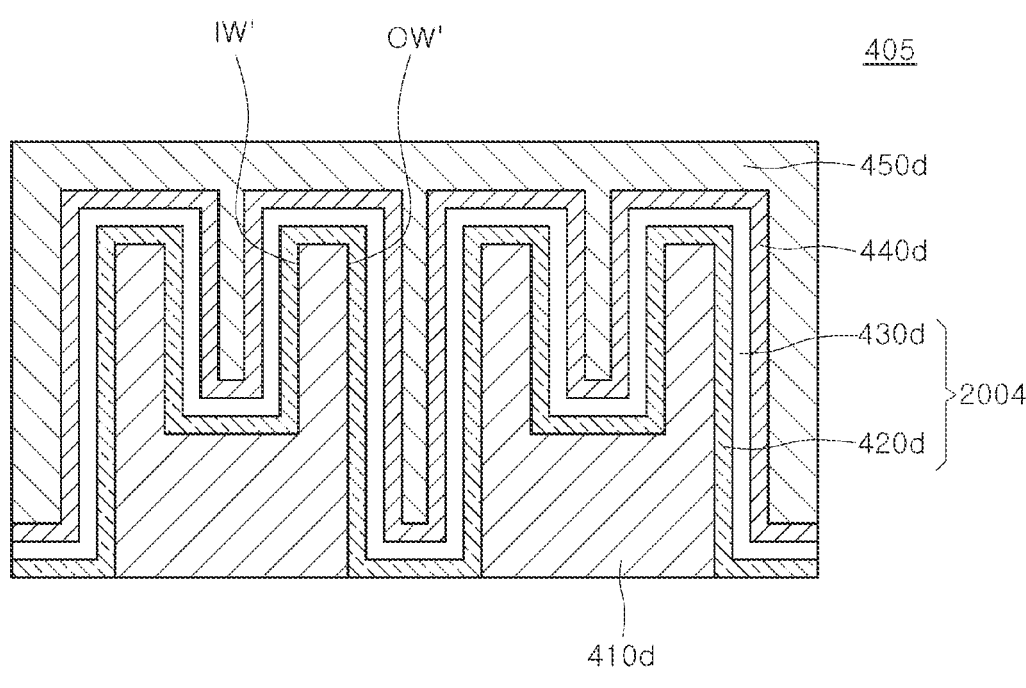
FIG. 21 is a cross-sectional view schematically illustrating a semiconductor device of a three-dimensional structure according to an embodiment of the present disclosure.
Figure 21:
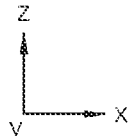

FIG. 21 is a cross-sectional view schematically illustrating a semiconductor device 405 of a three-dimensional structure according to an embodiment of the present disclosure. In an embodiment, the semiconductor device 405 may include a capacitor element. For example, the semiconductor device 405 may be applied to the cell capacitor 400 of the memory cell 8 of FIGS. 16A to 16C.

Referring to FIG. 21, the semiconductor device 405 may include a storage node electrode 410d of a three-dimensional structure, a capacitor dielectric structure 2004 disposed on the storage node electrode 410d, a barrier dielectric layer 440d disposed on the capacitor dielectric structure 2004, and a plate electrode 450d disposed on the barrier dielectric layer 440d. The capacitor dielectric structure 2004 may include a ferroelectric layer 420d and a dielectric layer 430d that are connected in series to each other. In the semiconductor device 405, the storage node electrode 410d may be an electrode to which an operating voltage is applied, and the plate electrode 450d may be a ground electrode.

The shape of the storage node electrode 410d of the semiconductor device 405 may be different from that of the semiconductor device 401 of FIG. 17. The rest of the configuration of the semiconductor device 405 except for the shape of the storage node electrode 410d may be substantially the same as that of the semiconductor device 401 of FIG. 17. Referring to FIG. 21, the storage node electrode 410d may have a composite shape in which the pillar shape of the storage node electrode 410a shown in FIG. 17 and the cylindrical shape of the storage node electrode 410c shown in FIG. 19 are combined. The storage node electrode 410d may have an inner wall surface IW' and an outer wall surface OW'. In the semiconductor device 405 of FIG. 21, a surface area of the inner wall surface IW' of the storage node electrode 410d may be reduced to be smaller than a surface area of the inner wall surface IW of the storage node electrode 410c of FIG. 20, so that structural stability of the storage node electrode 410d may be increased.

The ferroelectric layer 420d of the capacitor dielectric structure 2004 may be disposed to cover the inner wall surface IW' and the outer wall surface OW' of the storage node electrode 410d. The dielectric layer 430d and the barrier dielectric layer 440d may be disposed to sequentially cover the ferroelectric layer 420d. The configurations of the capacitor dielectric structure 2004, the barrier dielectric layer 440d, and the plate electrode 450d may be substantially the same as those of the capacitor dielectric structure 2001, the barrier dielectric layer 440a, and the plate electrode 450a of the semiconductor device 401 of FIG. 17, respectively.

Figure 22:
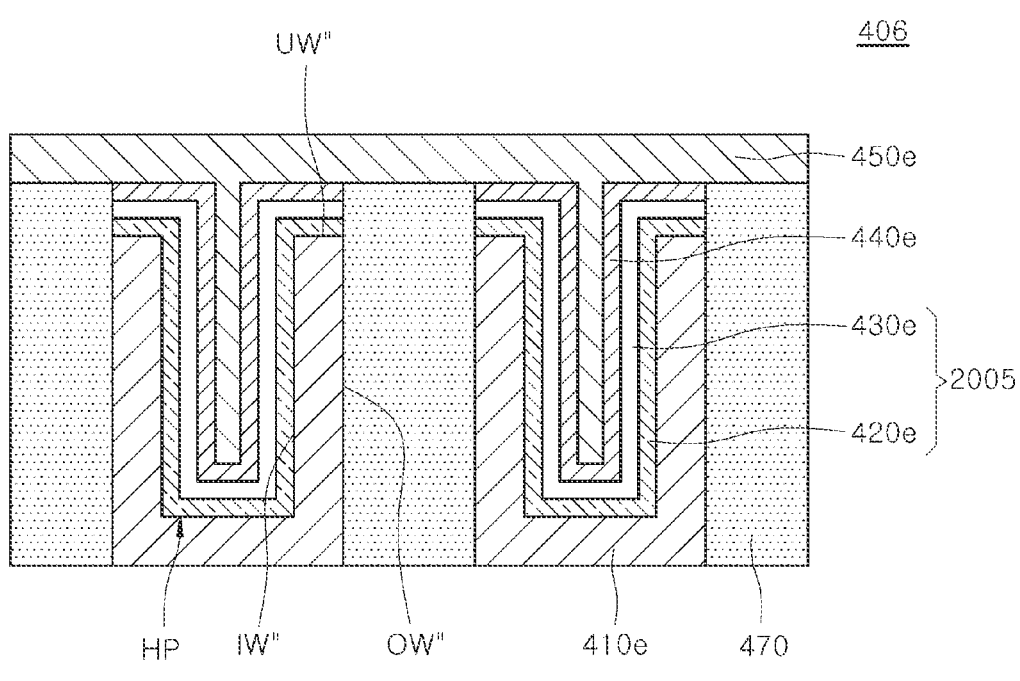
FIG. 22 is a cross-sectional view schematically illustrating a semiconductor device of a three-dimensional structure according to an embodiment of the present disclosure.
Figure 22:
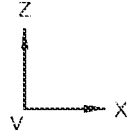

FIG. 22 is a cross-sectional view schematically illustrating a semiconductor device 406 of a three-dimensional structure according to an embodiment of the present disclosure. In an embodiment, the semiconductor device 406 may include a capacitor element. For example, the semiconductor device 406 may be applied to the cell capacitor 400 of the memory cell 8 of FIGS. 16A to 16C.

Referring to FIG. 22, the semiconductor device 406 may include a concave-shaped storage node electrode 410e, a capacitor dielectric structure 2005 disposed on the storage node electrode 410e, a barrier dielectric layer 440e disposed on the capacitor dielectric structure 2005, and a plate electrode 450e disposed on the barrier dielectric layer 440e. The capacitor dielectric structure 2005 may include a capacitor dielectric layer 420e and a barrier dielectric layer 430e that are connected in series to each other.

Referring to FIG. 22, a configuration of the storage node electrode 410e of the semiconductor device 406 may be different from that of the semiconductor device 401 of FIG. 17. The rest configuration of the semiconductor device 406 except for the storage node electrode 410e may be substantially the same as that of the semiconductor device 401 of FIG. 17.

Referring to FIG. 22, the storage node electrode 410e may have a concave-type three-dimensional structure. In an embodiment, the capacitor dielectric structure 2005 and the barrier dielectric layer 440e may be disposed on an inner wall surface IW''' and a top surface UW''' of the storage node electrode 410e. A device isolation layer 470 may be disposed on an outer wall surface OW''' of the storage node electrode 410e. The device isolation layer 470 may electrically insulate the adjacent storage node electrodes 410e from each other. The plate electrode 450e may be disposed on the barrier dielectric layer 440e and the device isolation layer 470.

The properties and functions of the capacitor dielectric structure 2005, the barrier dielectric layer 440e, and the plate electrode 450e may be substantially the same as those of the capacitor dielectric structure 2001, the barrier dielectric layer 440a, and the plate electrode 450a of the semiconductor device 401 of FIG. 17, respectively.

As described above, according to various embodiments of the present disclosure, the semiconductor device may include the capacitor dielectric structure and the barrier dielectric layer disposed between the storage node electrode and the plate electrode. The capacitance of the capacitor dielectric structure may be controlled to have substantially the same value as the capacitance of the semiconductor device. Accordingly, the capacitor dielectric structure may function as a substantial information storage dielectric layer of the semiconductor device. The barrier dielectric layer may be a barrier having a predetermined thickness, and may function to prevent deterioration of leakage current and the breakdown voltage of the semiconductor device. Accordingly, according to various embodiments of the present disclosure, it is possible to provide a semiconductor device capable of effectively securing a desired capacitance while improving leakage current characteristics and the breakdown voltage characteristics.

In an embodiment of the present disclosure, the dielectric structure DS3 including the first ferroelectric layer 10D, the dielectric layer 20D, and the second ferroelectric layer 30D described above with reference to FIG. 6 may be applied as a gate dielectric structure of a field effect transistor. Field effect transistors including the gate dielectric structure may be described in more detail through various embodiments in relation to the following FIGS. 23 to 25, 26A, 26B, 27A, 27B, 27C, 28A, 28B, and 28C.

Figure 23:
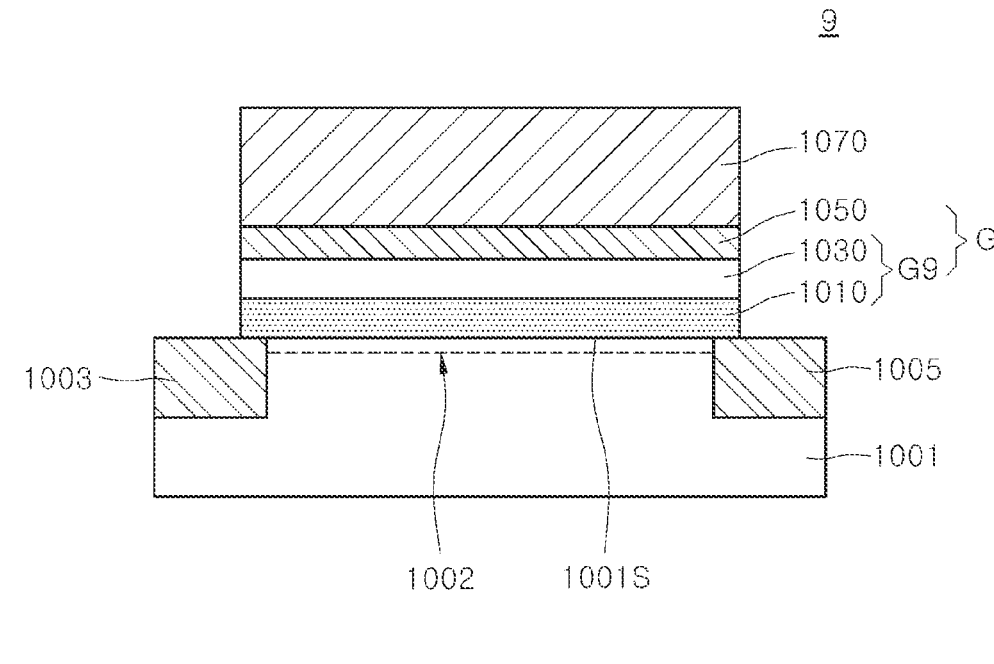
FIG. 23 is a cross-sectional view schematically illustrating a semiconductor device including a gate dielectric structure according to an embodiment of the present disclosure.
Figure 23:
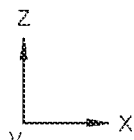

FIG. 23 is a cross-sectional view schematically illustrating a semiconductor device 9 including a gate dielectric structure according to an embodiment of the present disclosure. The semiconductor device 9 of FIG. 23 may include a field effect transistor.

Referring to FIG. 23, the semiconductor device 9 may include a substrate 1001 including a channel region 1002, a gate dielectric structure G9 disposed over the channel region 1002, a barrier dielectric layer 1050 disposed on the gate dielectric structure G9, and a gate electrode 1070 disposed on the barrier dielectric layer 1050. The gate dielectric structure G9 and the barrier dielectric layer 1050 may constitute a dielectric structure G of a transistor. In addition, the semiconductor device 9 may include a source region 1003 and a drain region 1005 that are disposed at opposite edges of the channel region 1002. The source region 1003 and the drain region 1005 may be portions of the substrate 1001.

The gate dielectric structure G9 may include a ferroelectric layer 1010 and a dielectric layer 1030. In an embodiment, the ferroelectric layer 1010 and the dielectric layer 1030 may be bonded to each other to be electrically connected in series to each other between the substrate 1001 and the gate electrode 1070. The ferroelectric layer 1010 may have the polarization characteristics described above with reference to FIG. 1 through bonding with the dielectric layer 1030. For example, the ferroelectric layer 1010 may exhibit a negative capacitance when polarization switching is performed in an electric field corresponding to a coercive field. The ferroelectric layer 1010 may exhibit a positive capacitance in the range of the electric field other than the coercive field. The dielectric layer 1030 may have the polarization characteristics shown in FIG. 3. The dielectric layer 1030 may have non-ferroelectricity, and may exhibit a positive capacitance. The gate dielectric structure G9 may have non-ferroelectricity.

Meanwhile, the barrier dielectric layer 1050 and the gate dielectric structure G9 are bonded to each other to be electrically connected in series between the substrate 1001 and the gate electrode 1070. The barrier dielectric layer 1050 may include a ferroelectric material. The barrier dielectric layer 1050 may have the polarization characteristics described above with reference to FIG. 2 through bonding with the gate dielectric structure G9 having non-ferroelectric characteristics. For example, the barrier dielectric layer 1050 may exhibit a negative capacitance when polarization switching is performed in an electric field corresponding to the coercive field. An absolute value of the coercive field of the barrier dielectric layer 1050 may be smaller than an absolute value of the coercive field of the ferroelectric layer 1010.

Referring to FIG. 23, the substrate 1001 may be provided. The substrate 1001 may include a semiconductor material. Specifically, the semiconductor material may include silicon (Si), germanium (Ge), gallium arsenide (GaAs), or the like. The substrate 1001 may be doped with an n-type or p-type dopant to have predetermined conductivity. In an embodiment, the substrate 1001 may be a single crystal silicon (Si) substrate doped with a n-type or p-type dopant.

The channel region 1002 may be a region of the substrate 1001 located directly under the gate dielectric structure G9. In an embodiment, the channel region 1002 may be a region of the substrate 1001 in which a conductive channel is formed when a gate voltage equal to or greater than a threshold voltage is applied between the gate electrode layer 1070 and the substrate 1001. The conductive channel may electrically connect the source region 1003 and the drain region 1005 to each other. Accordingly, when a voltage is applied between the source region 1003 and the drain region 1005, an electrical carrier such as an electron or hole may conduct through the conductive channel.

The ferroelectric layer 1010 may be disposed over the channel region 1002. As shown in FIG. 23, the ferroelectric layer 1010 may be disposed on a surface 1001S of the substrate 1001. The ferroelectric layer 1010 may include a ferroelectric material. In an embodiment, the ferroelectric layer 1010 may include hafnium zirconium oxide. In an embodiment, the ferroelectric layer 1010 may include a dopant doped into the hafnium zirconium oxide. The dopant may stabilize the ferroelectric characteristics of the ferroelectric layer 1010. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof.

In an embodiment, the ferroelectric layer 1010 may have a crystal structure of the orthorhombic crystal system. The ferroelectric layer 1010 may have a thickness of 1 nm to 5 nm, for example. The ferroelectric layer 1010 may have a single crystalline structure or a polycrystalline structure. In an embodiment, the ferroelectric layer 1010 may be an epi-growth layer. The ferroelectric layer 1010 may be epitaxially formed over the channel region 1002 through, for example, atomic layer deposition, pulsed layer deposition, or chemical vapor deposition.

The dielectric layer 1030 may be disposed on the ferroelectric layer 1010. The dielectric layer 1030 may have non-ferroelectricity. The dielectric layer 1030 may have paraelectricity, for example.

The dielectric layer 1030 may include a non-ferroelectric material. In an embodiment, the dielectric layer 1030 may include hafnium oxide, zirconium oxide, or a combination thereof. The dielectric layer 1030 may have a crystal structure of the monoclinic crystal system or the tetragonal crystal system. The dielectric layer 1030 may have a thickness of 1 nm to 5 nm, for example.

In an embodiment, the dielectric layer 1030 may be an epi-growth layer. The dielectric layer 1030 may be epitaxially formed on the ferroelectric layer 1010 through, for example, atomic layer deposition, pulsed layer deposition, or chemical vapor deposition.

The barrier dielectric layer 1050 may be disposed on the dielectric layer 1030. The barrier dielectric layer 1050 may include a ferroelectric material. In an embodiment, the barrier dielectric layer 1050 may include hafnium zirconium oxide. In another embodiment, the barrier dielectric layer 1050 may include a dopant doped in the hafnium zirconium oxide. The dopant may stabilize the ferroelectric characteristics of the barrier dielectric layer 1050. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof.

In an embodiment, the barrier dielectric layer 1050 may have a crystal structure of the orthorhombic crystal system. The barrier dielectric layer 1050 may have a thickness of 1 nm to 5 nm, for example. The barrier dielectric layer 1050 may have a single crystalline structure or a polycrystalline structure. In an embodiment, the barrier dielectric layer 1050 may be an epi-growth layer. The barrier dielectric layer 1050 may be epitaxially formed on the dielectric layer 1030 through, for example, atomic layer deposition, pulsed layer deposition, or chemical vapor deposition.

Referring to FIG. 23, the gate electrode 1070 may be disposed on the barrier dielectric layer 1050. The gate electrode 1070 may include a conductive material. The conductive material may include, for example, doped silicon (Si), gold (Au), silver (Ag), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIG. 23 again, the source region 1003 and the drain region 1005 may be disposed to be spaced apart from each other. The source region 1003 and the drain region 1005 may be doped with a different type of dopant from the substrate 1001. For example, when the substrate 1001 is doped with a p-type dopant, the source region 1003 and the drain region 1005 may be doped with an n-type dopant. As another example, when the substrate 1001 is doped with an n-type dopant, the source region 1003 and the drain region 1005 may be doped with a p-type dopant.

In an embodiment, an electrical circuit configuration of the gate dielectric structure G9 and the barrier dielectric layer 1050 disposed between the substrate 1001 and the gate electrode 1070 may be substantially the same as the electrical circuit configuration of the sub-dielectric structure DS1' and the second ferroelectric layer 20D connected in series in the circuit diagram of FIG. 6.

In an embodiment, in the gate dielectric structure G9, the ferroelectric layer 1010 and the dielectric layer 1030 may be electrically connected in series to each other. When an absolute value of a capacitance of the ferroelectric layer 1010 is greater than an absolute value of a capacitance of the dielectric layer 1030 and the ferroelectric layer 1010 has a negative capacitance, the gate dielectric structure G9 may have a capacitance greater than at least the capacitance of the dielectric layer 1030 in a predetermined range of an applied electric field. The gate dielectric structure G9 may have an increased capacitance by electrically connecting the ferroelectric layer 1010 having a negative capacitance to the dielectric layer 1030 having a positive capacitance in series.

In an embodiment, the gate dielectric structure G9 and the barrier dielectric layer 1050 may be connected in series between the substrate 1001 and the gate electrode 1070. In this case, an absolute value of a capacitance of the barrier dielectric layer 1050 may be greater than an absolute value of the capacitance of the gate dielectric structure G9. For example, the absolute value of the capacitance of the barrier dielectric layer 1050 may be 2 to 10 times the absolute value of the capacitance of the gate dielectric structure G9. As another example, the absolute value of the capacitance of the barrier dielectric layer 1050 may be greater than 10 times the absolute value of the capacitance of the gate dielectric structure G9. In an embodiment, when the barrier dielectric layer 1050 and the ferroelectric layer 1010 include substantially the same material, a thickness of the barrier dielectric layer 1050 may be smaller than a thickness of the ferroelectric layer 1010. In an embodiment, the absolute value of the capacitance of the barrier dielectric layer 1050 may be greater than the absolute value of the capacitance of the ferroelectric layer 1010.

As a result, a capacitance of a dielectric structure G in which the gate dielectric structure G9 and the barrier dielectric layer 1050 are connected in series may be substantially the same as the capacitance of the gate dielectric structure G9. The barrier dielectric layer 1050 may be a barrier layer having a predetermined thickness, and may function to improve the leakage current characteristics and the breakdown voltage characteristics generated through the dielectric structure G between the substrate 1001 and the gate electrode 1070.

In some embodiments, the stacking order of the gate dielectric structure G9 and the barrier dielectric layer 1010 over the channel region 1002 may be changed. For example, the barrier dielectric layer 1050 may be disposed on the surface 1001S of the substrate 1001, and the gate dielectric structure G9 may be disposed on the barrier dielectric layer 1050.

In some embodiments, in the gate dielectric structure G9, the stacking order of the ferroelectric layer 1010 and the dielectric layer 1030 may be changed. For example, the dielectric layer 1030 may be disposed on the surface 1001S of the substrate 1001, and the ferroelectric layer 1010 may be disposed on the dielectric layer 1030.

In some embodiments, an interfacial insulation layer may be additionally disposed between the barrier dielectric layer 1050 and the gate electrode 1070. In an embodiment, the interfacial insulation layer may suppress material exchange between the barrier dielectric layer 1050 and the gate electrode 1070, and may form a potential barrier between the gate dielectric layer 1030 and the gate electrode 1050. Accordingly, the material composition of the barrier dielectric layer 1050 and the gate electrode 1070 may be prevented from being changed. A configuration of the interfacial insulation layer may be substantially the same as that of the interfacial insulation layer 160 of the semiconductor device 5 described with reference to FIG. 13.

In some other embodiments, a crystallization seed layer may be disposed between the substrate 1001 and the ferroelectric layer 1010. The crystallization seed layer may induce crystallization of the ferroelectric layer 1010. A configuration of the crystallization seed layer may be substantially the same as that of the crystallization seed layer 170 of the semiconductor device 6 described with reference to FIG. 14.

Figure 24:
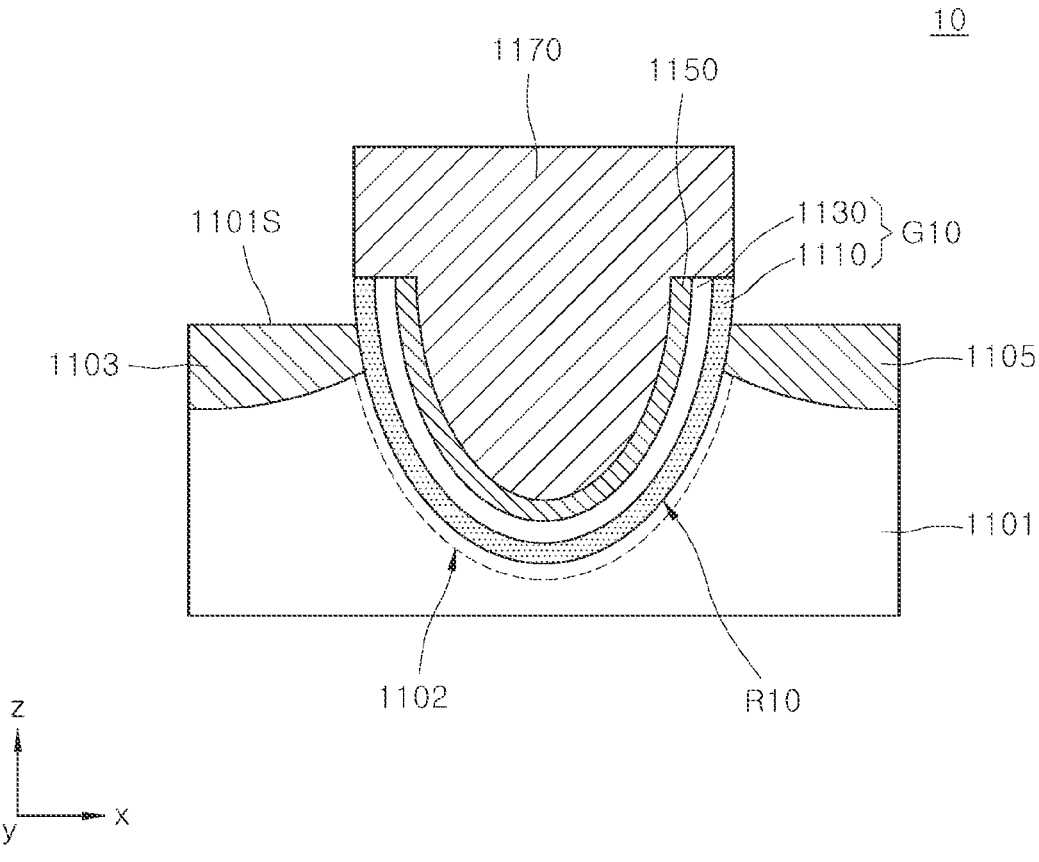
FIG. 24 is a cross-sectional view schematically illustrating a semiconductor device including a gate dielectric structure according to another embodiment of the present disclosure.

FIG. 24 is a cross-sectional view schematically illustrating a semiconductor device 10 including a gate dielectric structure according to another embodiment of the present disclosure. The semiconductor device 10 of FIG. 24 may include a field effect transistor. The semiconductor device 10 of FIG. 24 may be different from the semiconductor device 9 of FIG. 23 in configurations of a gate dielectric structure G10, a barrier dielectric layer 1150, and a gate electrode 1170.

Referring to FIG. 24, the semiconductor device 10 may include a substrate 1101, a recessed space R10 formed in the substrate 1101, the gate dielectric structure G10 disposed in the recessed space R10, the barrier dielectric layer 1150 disposed on the gate dielectric structure G10, and the gate electrode 1170 disposed on the barrier dielectric layer 1150. The gate dielectric structure G10 may include a ferroelectric layer 1110 and a dielectric layer 1130. In addition, the semiconductor device 10 may include a source region 1103 and a drain region 1105 disposed in regions of the substrate 1101, positioned opposite to each other in the recessed space R10. In this case, a channel region 1102 of the semiconductor device 10 may be formed in an inner region of the substrate 1101 along an interface with the gate dielectric structure G10.

The material composition of the substrate 1101, the source region 1103, the drain region 1105, the gate dielectric structure G10, the barrier dielectric layer 1150, and the gate electrode 1170 may be substantially the same as the material composition of the substrate 1001, the source region 1003, the drain region 1005, the gate dielectric structure G9, the barrier dielectric layer 1050, and the gate electrode 1070 described above with reference to FIG. 23.

However, compared to the semiconductor device 9 of FIG. 23 in which the gate dielectric structure G9, the barrier dielectric layer 1050, and the gate electrode 1070 are disposed over the substrate 1001, in the semiconductor device 10 of FIG. 24, a portion of each of the gate dielectric structure G10, the barrier dielectric layer 1150, and the gate electrode 1170 may be disposed in the recessed region R10 formed into the substrate 1101 from a surface 1101S of the substrate 1101, respectively. In addition, another portion of each of the gate dielectric structure G10, the barrier dielectric layer 1150, and the gate electrode 1170 may be disposed over the surface 1101S of the substrate 1101. Because the semiconductor device 10 includes the recessed region R10, it is possible to secure a relatively increased channel region 1102 as compared to the semiconductor device 9 of FIG. 23.

In an embodiment, the semiconductor device 10 of FIG. 24 may be applied to the transistor of the memory cell 8 described above with reference to FIGS. 16A to 16C. The substrate 1101, the source region 1103, the drain region 1105, and the gate electrode 1170 of the semiconductor device 10 may correspond to the substrate 301, the first doping region 310, the second doping region 311, and the gate electrode 308 of the semiconductor device 8 of FIGS. 16A to 16C, respectively. In addition, the dielectric structure including the gate dielectric structure G10 and the barrier dielectric layer 1150 may correspond to the gate insulation layer 307 of the semiconductor device 8 of FIGS. 16A to 16C.

Figure 25:
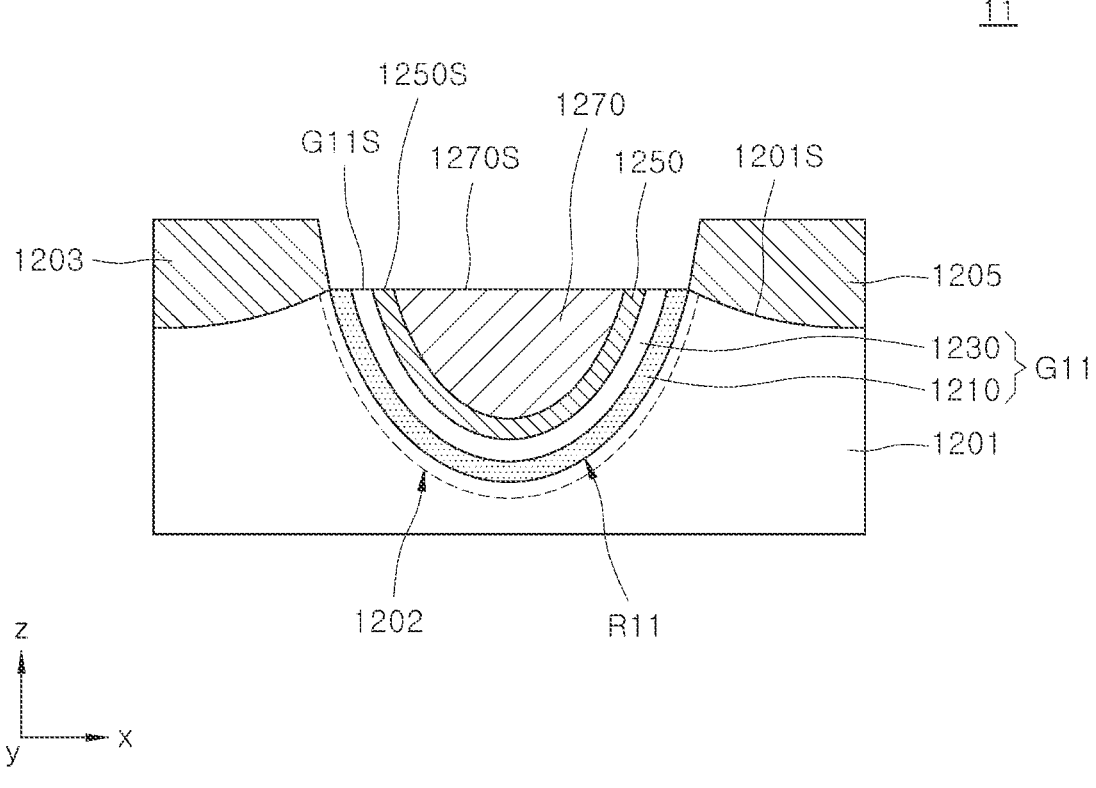
FIG. 25 is a cross-sectional view schematically illustrating a semiconductor device including a gate dielectric structure according to an embodiment of the present disclosure.

FIG. 25 is a cross-sectional view schematically illustrating a semiconductor device 11 including a gate dielectric structure according to an embodiment of the present disclosure. The semiconductor device 11 of FIG. 25 may include a field effect transistor. In the semiconductor device 11 of FIG. 25 may be different from the semiconductor device 9 of FIG. 23, in configurations of a gate dielectric structure G11, a barrier dielectric layer 1250, and a gate electrode 1270.

Referring to FIG. 25, the semiconductor device 11 may include a substrate 1201, a recessed space R11 formed in the substrate 1201, the gate dielectric structure G11 disposed in the recessed space R11, the barrier dielectric layer 1250 disposed on the gate dielectric structure G11 in the recessed space R11, and the gate electrode 1270 disposed on the barrier dielectric layer 1250 in the recessed space R11. The gate dielectric structure G11 may include a ferroelectric layer 1210 and a dielectric layer 1230. In addition, the semiconductor device 11 may include a source region 1203 and a drain region 1205 that are disposed at regions of the substrate 1201, located opposite to each other in the recessed space R11. In this case, a channel region 1202 of the semiconductor device 11 may be formed in an inner region of the substrate 1201 along an interface with the gate dielectric structure G11.

The material composition of the substrate 1201, the source region 1203, the drain region 1205, the gate dielectric structure G11, the barrier dielectric layer 1250, and the gate electrode 1270 may be substantially the same as the material composition of substrate 1001, source region 1003, drain region 1005, gate dielectric structure G9, barrier dielectric layer 1050, and gate electrode 1070 described above with reference to FIG. 23.

However, as compared to the semiconductor device 9 of FIG. 23 in which the gate dielectric structure G9, the barrier dielectric layer 1050, and the gate electrode 1070 are disposed over the substrate 1001, in the semiconductor device 11 of FIG. 25, all of the gate dielectric structure G11, the barrier dielectric layer 1250, and the gate electrode 1270 may be disposed in the recessed region R11 formed in the substrate 1201 from a surface 1201S of the substrate 1201. Accordingly, a top surface G11S of the gate dielectric structure G11, a top surface 1250S of the barrier dielectric layer 1250, and a top surface 1270S of the gate electrode 1270 may be positioned at a bottom level than the surface 1201S of the substrate 1201. Because the semiconductor device 11 includes the recessed region R11, it is possible to secure a relatively increased channel region 1202 as compared to the semiconductor device 9 of FIG. 23.

In an embodiment, the semiconductor device 11 of FIG. 25 may be applied to the transistor of the memory cell 8 described above with reference to FIGS. 16A to 16C. The substrate 1201, the source region 1203, the drain region 1205, and the gate electrode 1270 of the semiconductor device 11 may correspond to the substrate 301, the first doped region 310, the second doped region 311, the gate insulation layer 307, and the gate electrode 308 of the semiconductor device 10 of FIGS. 16A to 16C, respectively. In addition, a dielectric structure including the gate dielectric structure G11 and the barrier dielectric layer 1250 of the semiconductor device 11 may correspond to the gate insulation layer 307 of the semiconductor device 8 of FIGS. 16A to 16C.

Figure 26A:
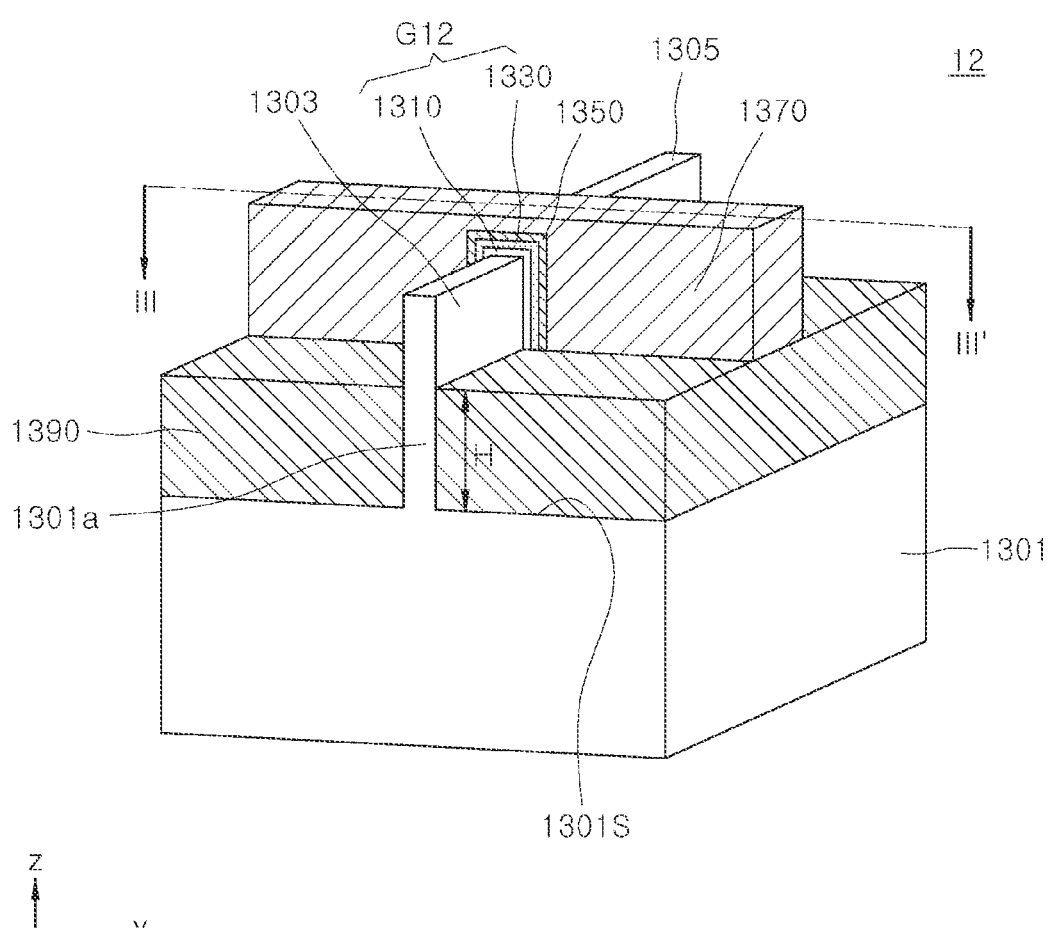
FIG. 26A is a perspective view schematically illustrating a semiconductor device according to an embodiment of the present disclosure.
Figure 26B:
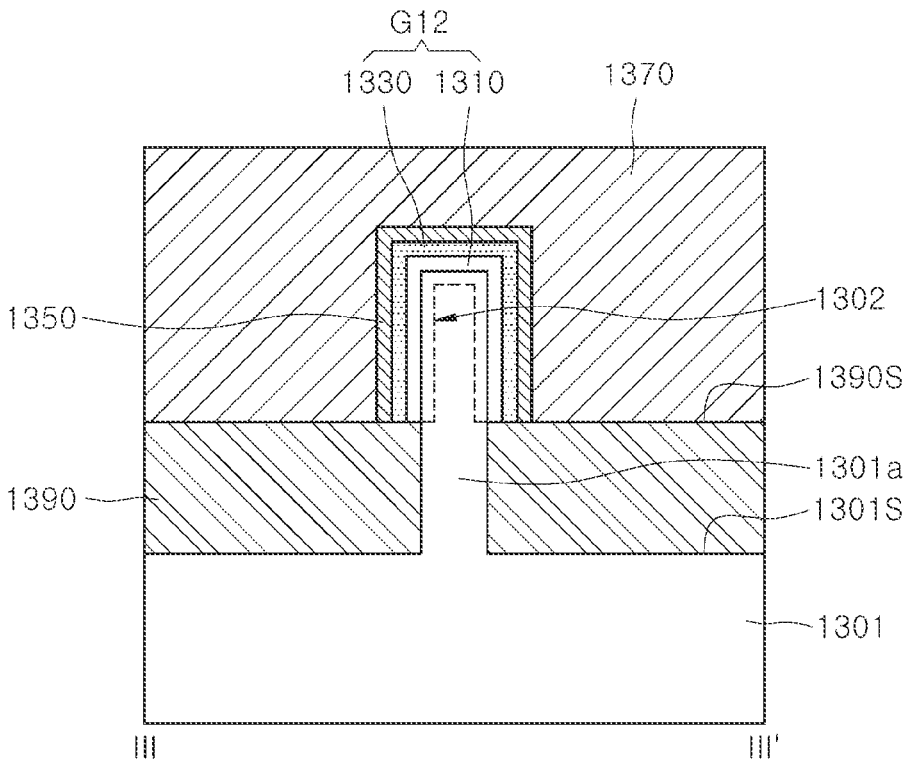
FIG. 26B is a cross-sectional view of the semiconductor device of FIG. 26A taken along line III-III'.
Figure 26B:
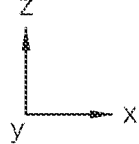

FIG. 26A is a perspective view schematically illustrating a semiconductor device 12 according to an embodiment of the present disclosure. FIG. 26B is a cross-sectional view of the semiconductor device of FIG. 26A taken along a line M-M'. In an embodiment, the semiconductor device 12 of FIGS. 26A and 26B may include a transistor having a three-dimensional structure. In addition, the semiconductor device 12 may include a conductive channel formed in a fin structure that is an active layer.

Referring to FIGS. 26A and 26B, the semiconductor device 12 may include a substrate 1301, a fin structure 1301a extending in a direction (e.g., the z-direction) substantially perpendicular to a surface 1301S of the substrate 1301, a base insulation layer 1390 disposed on the substrate 1301 to cover a portion of the fin structure 1301a, a gate dielectric structure G12 disposed on the base insulation layer 1390 to cover a portion of the fin structure 1301a, a barrier dielectric layer 1350 disposed to cover the gate dielectric structure G12, and a gate electrode 1370 disposed on the base insulation layer 1390 to cover the barrier dielectric layer 1350. The gate dielectric structure G12 may include a ferroelectric layer 1310 and a dielectric layer 1330. In addition, the semiconductor device 12 may include a source region 1303 and a drain region 1305 that are formed in different portions of the fin structure 1301a. The ferroelectric layer 1310 and the dielectric layer 1330 may be electrically connected in series to each other between the fin structure 1301a serving as an active layer and the gate electrode 1370. The gate dielectric structure G12 and the barrier dielectric layer 1350 may be electrically connected in series between the fin structure 1301a serving as the active layer and the gate electrode 1370.

The substrate 1301 may include a semiconductor material. The substrate 1301 may be doped with an n-type dopant or a p-type dopant. The fin structure 1301a may be disposed on the substrate 1301 to extend in a direction (e.g., the z-direction) substantially perpendicular to the surface 1301S of the substrate 1301 and in a direction (e.g., the y-direction) parallel to the surface 1301S of the substrate 1301. The fin structure 1301a may be made of substantially the same material as the substrate 1301. As an embodiment, the fin structure 1301a may be formed by patterning the substrate 1301. The fin structure 1301a may correspond to an active layer for an electrical switching operation of the semiconductor device 12.

The base insulation layer 1390 may be disposed on the substrate 1301 to cover the fin structure 1301a to a predetermined height H. The base insulation layer 1390 may include, for example, oxide, nitride, oxynitride, or a combination of two or more thereof.

A portion of the fin structure 1301a protruding above the base insulation layer 1390 may be sequentially covered by the gate dielectric structure G12, the barrier dielectric layer 1350, and the gate electrode 1370. Referring to FIG. 26B, the portion of the fin structure 1301a sequentially covered by the gate dielectric structure G12, the barrier dielectric layer 1350, and the gate electrode 1350 may be a channel region 1302.

In an embodiment, the gate dielectric structure G12 may have substantially the same dielectric characteristics as the gate dielectric structure G9 of the semiconductor device 9 described above with reference to FIG. 23. The barrier dielectric layer 1350 may have substantially the same dielectric characteristics as the barrier dielectric layer 1050 of the semiconductor device 9 of FIG. 23.

Referring to FIG. 26B, the fin structure 1301a, the gate dielectric structure G12, and the barrier dielectric layer 1350 may be disposed to protrude upward (i.e., in the z-direction) from a surface 1390S of the base insulation layer 1390.

Referring to FIGS. 26A and 26B again, the portions of the fin structure 1301a protruding above the base insulation layer 1390 other than the channel region 1302 may be doped with an n-type or p-type dopant to be converted into a source region 1303 and a drain region 1305. In an embodiment, when the fin structure 1301a is doped with a p-type dopant, the source region 1301 and the drain region 1305 may be doped with an n-type dopant.

When a gate voltage equal to or greater than a threshold voltage is applied between the gate electrode 1370 and the fin structure 1301a, a conductive channel may be formed in the channel region 1302. The conductive channel may be formed in an inner region of the fin structure 1301a forming an interface with the gate dielectric structure G12. The conductive channel may electrically connect the source region 1303 and the drain region 1305 to each other. Then, when an operating voltage is applied between the source region 1303 and the drain region 1305, conductive carriers such as electrons or holes will conduct between the source region 1303 and the drain region 1305 through the conductive channel. In an embodiment of the present disclosure, the conductive channel may be implemented in the fin structure 1301a protruding in a three-dimensional structure, thereby increasing the volume of the conductive channel. As a result, the density of the conductive carriers conducting through the conductive channel may increase, thereby increasing the channel current of the semiconductor device 12.

Figure 27A:
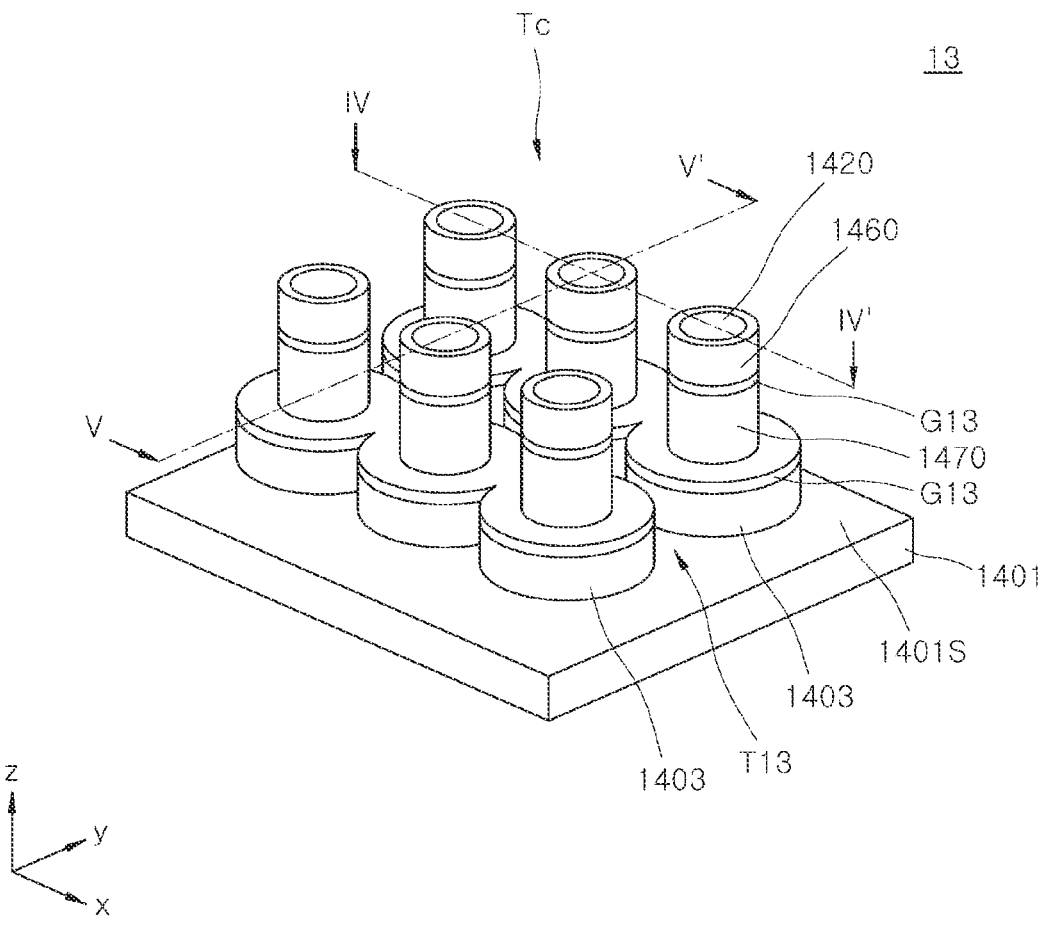
FIG. 27A is a perspective view schematically illustrating a semiconductor device according to an embodiment of the present disclosure.
Figure 27B:
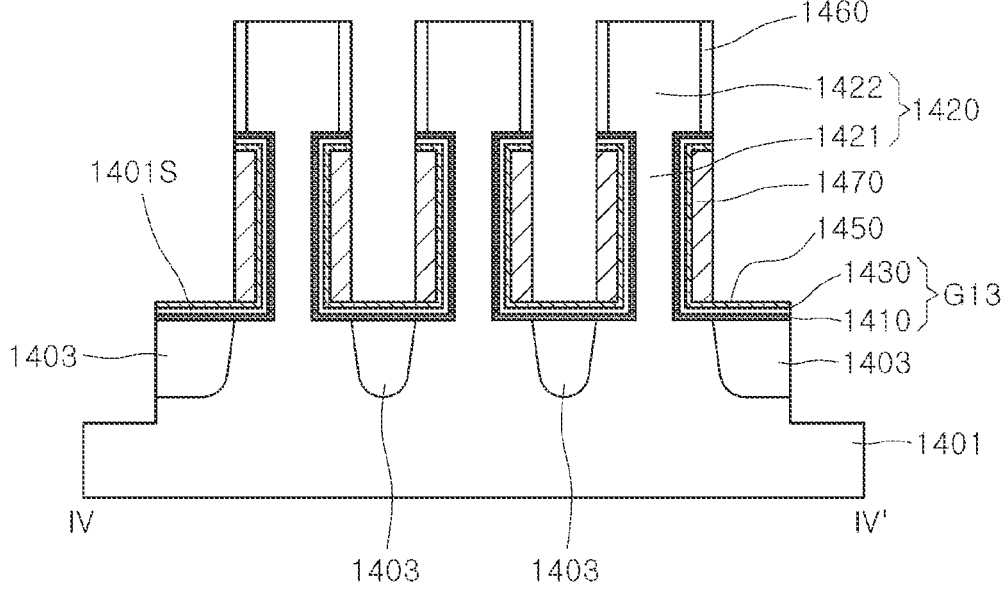
FIG. 27B is a cross-sectional view of the semiconductor device of FIG. 27A taken along line IV-IV'.
Figure 27B:
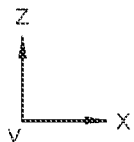
Figure 27C:
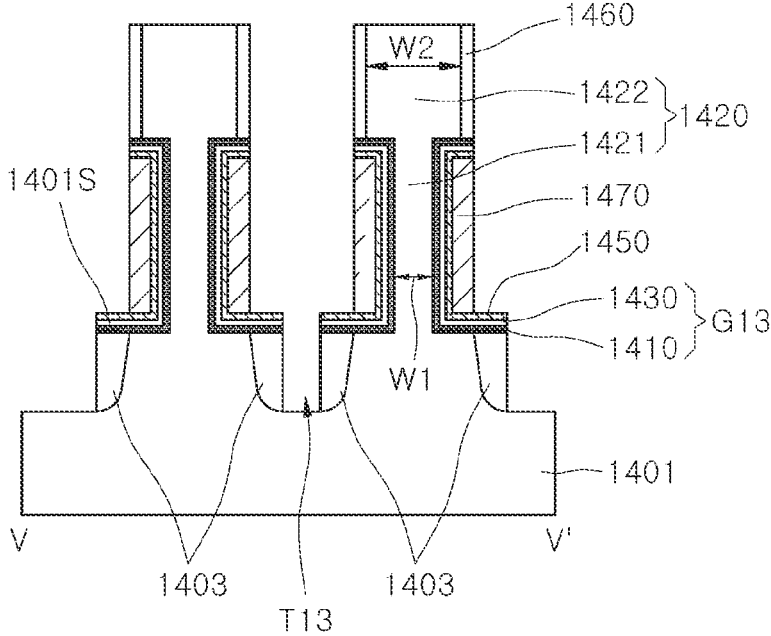
FIG. 27C is a cross-sectional view of the semiconductor device of FIG. 27A taken along line V-V'.
Figure 27C:
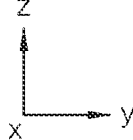

FIG. 27A is a perspective view schematically illustrating a semiconductor device 13 according to an embodiment of the present disclosure. FIG. 27B is a cross-sectional view of the semiconductor device of FIG. 27A taken along a line IV-IV'. FIG. 27C is a cross-sectional view of the semiconductor device of FIG. 27A taken along a line V-V'.

In an embodiment, the semiconductor device 13 of FIGS. 27A to 27C may include transistors of a three-dimensional structure, each of the transistors including a vertical channel over a substrate 1401. For convenience of description, an insulation layer surrounding the illustrated components of the semiconductor device 13 is omitted in FIGS. 27A to 27C.

Referring to FIGS. 27A to 27C, the semiconductor device 13 may include a plurality of transistors Tc disposed over the substrate 1401. The plurality of transistors Tc may be electrically separated from each other by isolation trenches T13 formed in the substrate 1401.

Each of the plurality of transistors Tc may include the substrate 1401, an active pillar structure 1420 extending in a direction (e.g., z-direction) substantially perpendicular to a surface 1401S of the substrate 1401, a gate dielectric structure G13 disposed to surround outer surface of the active pillar structure 1420, a barrier dielectric layer 1450 disposed on the gate dielectric structure G13, and a gate electrode 1470 disposed on the barrier dielectric layer 1450. The gate dielectric structure G13 may include a ferroelectric layer 1410 and a dielectric layer 1430. In addition, the semiconductor device 13 may include bit lines 1403 buried in the substrate 1401. The ferroelectric layer 1410 and the dielectric layer 1430 may be electrically connected in series between the active pillar structure 1420 and the gate electrode 1470. The gate dielectric structure G13 and the barrier dielectric layer 1450 may be electrically connected in series between the active pillar structure 1420 and the gate electrode 1470.

The substrate 1401 may include a semiconductor material. The substrate 1401 may be doped with an n-type or p-type dopant. In an embodiment, portions of the substrate 1410 may be doped with a dopant to form the bit lines 1403. In an embodiment, the bit lines 1403 may be formed by, for example, doping the substrate 1401 by an ion implantation method. In an embodiment, when the substrate 1401 is doped into p-type, the bit lines 1403 may be doped into n-type.

The pillar structures 1420 may correspond to active layers for an electrical switching operation of the semiconductor device 13. Each of the active pillar structures 1420 may include first and second pillar portions 1421 and 1422 having different diameters on a cross-section cut in a direction substantially parallel to the surface 1401S of the substrate 1401. A diameter W1 of the first pillar portion 1421 may be smaller than a diameter W2 of the second pillar portion 1422. Each of the active pillar structures 1420 may function as a channel region of the transistor Tc. The active pillar structures 1420 may be made of substantially the same material as the substrate 1401. In an embodiment, the substrate 1401 and the active pillar structures 1420 may be doped with a p-type.

Referring to FIGS. 27A to 27C, the gate dielectric structure G13 and the barrier dielectric layer 1450 may be disposed to sequentially cover the first pillar portion 1421. In an embodiment, the gate dielectric structure G13 may have substantially the same dielectric characteristics as the gate dielectric structure G9 of the semiconductor device 9 described above with reference to FIG. 23. The barrier dielectric layer 1450 may have substantially the same dielectric characteristics as the barrier dielectric layer 1050 of the semiconductor device 9 of FIG. 23.

In an embodiment, the material composition of the gate dielectric structure G13, the barrier dielectric layer 1450, and the gate electrode 1470 may be substantially the same as the material composition of the gate dielectric structure G12, the barrier dielectric layer 1350, and the gate electrode 1370 of the semiconductor device 12 of FIGS. 26A and 26B.

Referring to FIGS. 27A to 27C, the second pillar portion 1422 may be disposed on the first pillar portion 1421. An insulation spacer 1460 may be disposed on an outer wall surface of the second pillar portion 1422. A source line may be disposed over the second pillar portion 1422. The source line may function as a drain electrode with respect to the second pillar portion 1422.

According to an embodiment of the present disclosure, the channel region of the transistor may be formed in the active pillar structure 1420 extending in the direction (e.g., the z-direction) substantially perpendicular to the surface 1401S of the substrate 1401. The gate dielectric structure G13, the barrier dielectric layer 1450, and the gate electrode 1470 may be disposed to surround an outer wall surface of the active pillar structure 1420, so that the conductive channel may be formed in a direction (e.g., the z-direction) substantially perpendicular to the surface 1401S of the substrate 1401 in the channel region. Accordingly, it is possible to effectively secure the channel region of the transistor in the semiconductor device 13.

Figure 28A:
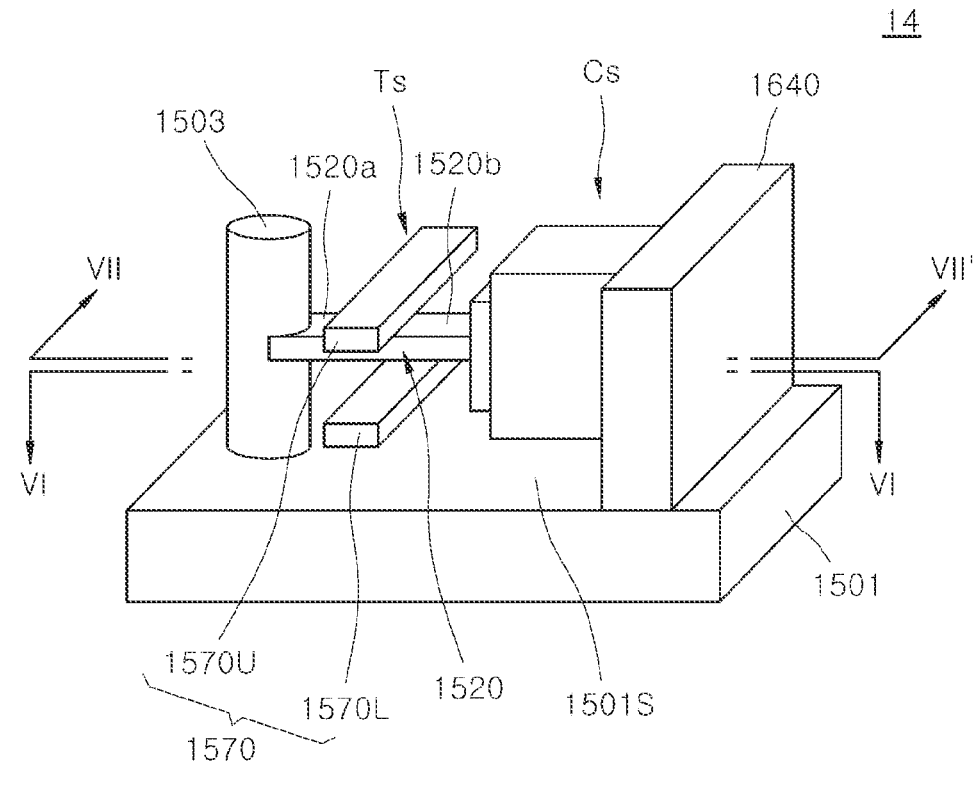
FIG. 28A is a perspective view schematically illustrating a semiconductor device according to an embodiment of the present disclosure.
Figure 28B:
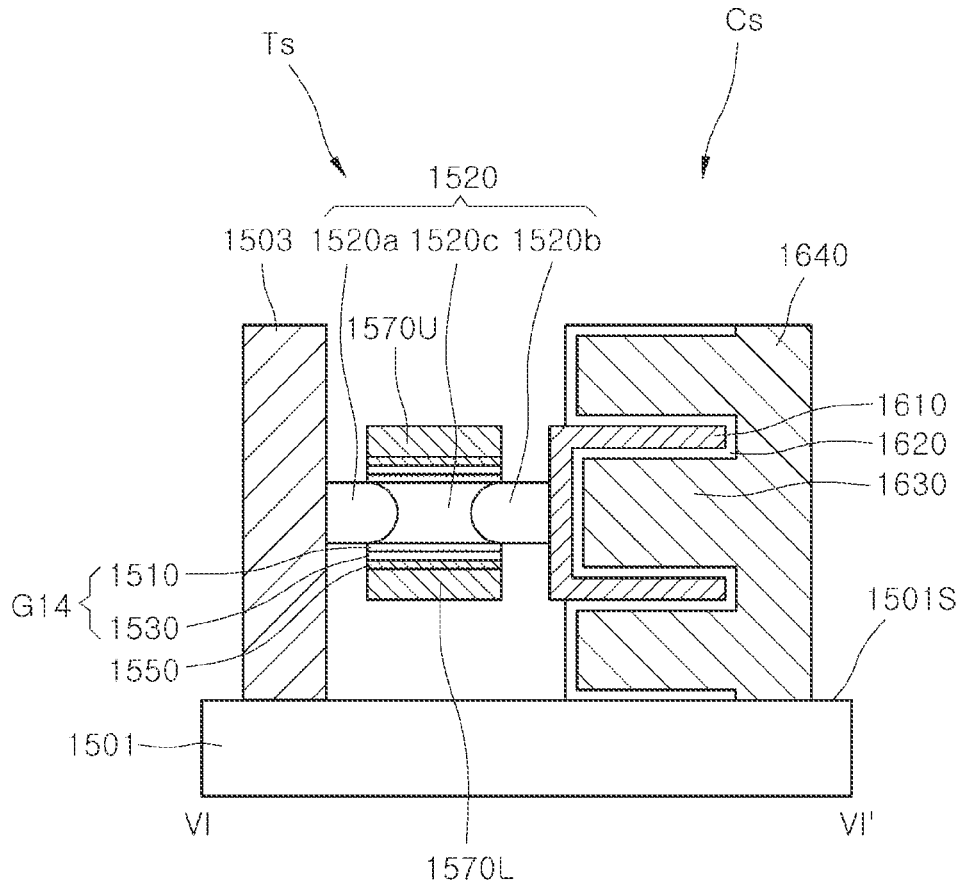
FIG. 28B is a cross-sectional view of the semiconductor device of FIG. 28A taken along line VI-VI'.
Figure 28B:
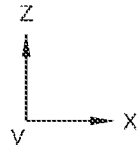
Figure 28C:
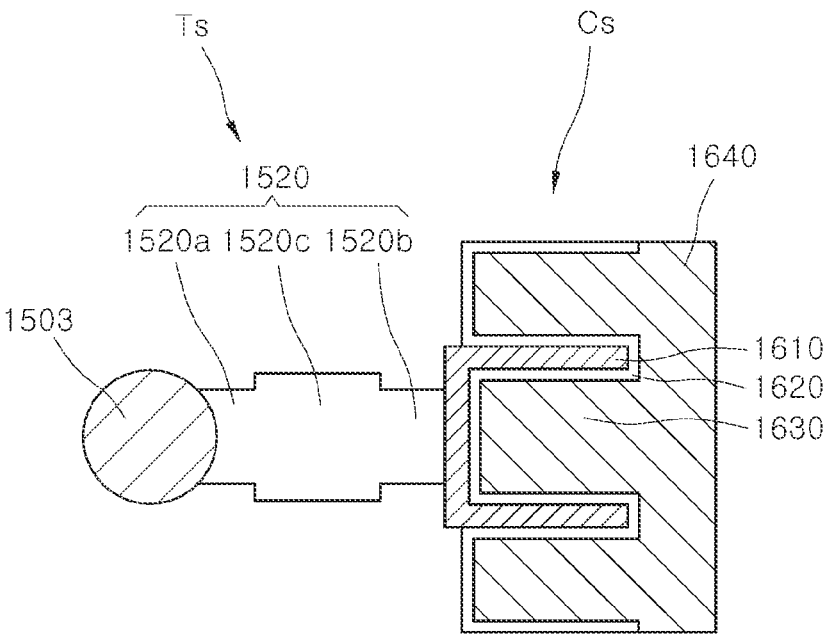
FIG. 28C is a cross-sectional view of the semiconductor device of FIG. 28A taken along line VII-VII' and shown on the x-y plane.
Figure 28C:
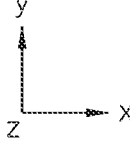

FIG. 28A is a perspective view schematically illustrating a semiconductor device 14 according to an embodiment of the present disclosure. FIG. 28B Is a cross-sectional view of the semiconductor device of FIG. 28A taken along a line VI-VI'. FIG. 28C is a cross-sectional view of the semiconductor device of FIG. 28A taken along a line VII-VII' and shown on the x-y plane.

In an embodiment, the semiconductor device 14 of FIGS. 28A to 28C may include a base structure 1501 and a transistor Ts of a three-dimensional structure disposed over the base structure 1501. In addition, the semiconductor device 14 may include a capacitor Cs that is electrically connected to the transistor Ts over the base structure 1501. For convenience of description, an insulation layer surrounding the illustrated components of the semiconductor device 14 is omitted in FIGS. 28A to 28C.

Referring to FIGS. 28A to 28C, the semiconductor device 14 may include the base structure 1501. The base structure 1501 may include a substrate. In addition, the base structure 1501 may include at least one conductive layer and at least one interlayer insulation layer disposed over the substrate. The base structure 1501 may support the transistor Ts and the capacitor Cs of the semiconductor device 14. The substrate may include a semiconductor material.

The transistor Ts of the semiconductor device 14 may include an active layer 1520 disposed over the base structure 1501, a gate dielectric structure G14 disposed on a top surface and a bottom surface of the active layer 1520, a barrier dielectric layer 1550 disposed on the gate dielectric structure G14, and a gate electrode 1570 disposed on the barrier dielectric layer 1550. The gate dielectric structure G14 may include a ferroelectric layer 1510 and a dielectric layer 1530. The ferroelectric layer 1510 and the dielectric layer 1530 may be electrically connected in series to each other between the active region 1520 and the gate electrode 1570. The gate dielectric structure G14 and the barrier dielectric layer 1550 may be electrically connected in series to each other between the active layer 1520 and the gate electrode 1570. The capacitor Cs of the semiconductor device 14 may include a storage node electrode 1610, an information storage dielectric layer 1620, and a plate electrode 1630 which are disposed over the base structure 1501.

The active layer 1520 may be disposed on a plane that is substantially parallel to a surface 1501S of the base structure 1501. Although not shown, the surface 1501S of the base structure 1501 may be a plane that is substantially parallel to a surface of the substrate. The active layer 1520 may include a source region 1520*a* and a drain region 1520*b* that are disposed to be spaced apart from each other. In addition, the active layer 1520 may include a channel region 1520*c* between the source region 1520*a* and the drain region 1520*b*. Atop surface and a bottom surface of the channel region 1520*c* may be covered by the gate dielectric structure G14.

The active layer 1520 may include a semiconductor material. The semiconductor material may include silicon (Si), germanium (Ge), gallium arsenide (GaAs), or the like. The active layer 1520 may be doped with an n-type or p-type dopant. In an embodiment, the source region 1520*a* and the drain region 1520*b* may be doped with an n-type dopant, and the channel region 1520*c* may be doped with a p-type dopant. In another embodiment, the source region 1520*a* and the drain region 1520*b* may be doped with a p-type dopant, and the channel region 1520*c* may be doped with an n-type dopant. The channel region 1520*c* may extend in a direction (e.g., an x-direction) substantially parallel to the surface 1501S of the base structure 1501.

The gate dielectric structure G14 may be disposed on the top surface and the bottom surface of the active layer 1520. Referring to FIG. 28B, the gate dielectric structure G14 may include a ferroelectric layer 1510 and a dielectric layer 1530. In an embodiment, the ferroelectric layer 1510 may be disposed on the channel region 1520*c*, and the dielectric layer 1530 may be disposed on the ferroelectric layer 1510. In an embodiment, the gate dielectric structure G14 may have substantially the same dielectric characteristics as the gate dielectric structure G9 of the semiconductor device 9 described above with reference to FIG. 23.

The barrier dielectric layer 1550 may be disposed on the gate dielectric structure G14. The barrier dielectric layer 1550 may have substantially the same dielectric characteristics as the barrier dielectric layer 1050 of the semiconductor device 9 described above with reference to FIG. 23. The material composition of the gate dielectric structure G14 and the barrier dielectric layer 1550 may be substantially the same as the material composition of the gate dielectric structure G9 and the barrier dielectric layer 1050 of the semiconductor device 9 described above with reference to FIG. 23.

The gate electrode 1570 may be disposed on the barrier dielectric layer 1550. The gate electrode 1570 may include an top electrode layer 1570U and a bottom electrode layer 1570L. The top electrode layer 1570U and the bottom electrode layer 1570L may be electrically connected to each other, and may control the channel region 1520*c* at the same time. Accordingly, when a gate voltage equal to or greater than a threshold voltage is applied to the top electrode layer 1550U and the bottom electrode layer 1550L at the same time, a pair of conductive channels may be formed in the channel region 1520c. The material composition of the top electrode layer 1570U and the bottom electrode layer 1570U may be substantially the same as that of the gate electrode 1070 of the semiconductor device 9 described above with reference to FIG. 23.

In some embodiments, the gate dielectric structure G14 and the barrier dielectric layer 1550 may be disposed on only one of the top surface and the bottom surface of the active layer 1520. Accordingly, only one of the top electrode layer and the bottom electrode layer of the gate electrode 1570 may be disposed on the gate dielectric structure G14.

Referring to FIGS. 28A to 28C, the source region 1520a of the active layer 1520 may be electrically connected to a bit line 1503. The bit line 1503 may extend in a direction (e.g., the z-direction) that is substantially perpendicular to the surface 1501S of the base structure 1501. The bit line 1503 may include a conductive pillar structure. Meanwhile, the drain region 1520b of the active layer 1520 may be electrically connected to the storage node electrode 1610 of the capacitor Cs.

The storage node electrode 1610 of the capacitor Cs may have a cylindrical shape. The information storage dielectric layer 1620 may be disposed on the storage node electrode 1610. The plate electrode 1630 may be disposed to cover the information storage dielectric layer 1620. The plate electrode 1630 may be connected to a plate line 1640. The plate line 1640 may extend in the y-direction.

Each of the storage node electrode 1610 and the plate electrode 1630 may include a conductive material. The information storage dielectric layer 1620 may include, for example, oxide, nitride, oxynitride, or a combination of two or more thereof. In an embodiment, a configuration of the storage node electrode 1610 of the capacitor Cs may be substantially the same as that of the storage node electrode 410c of the semiconductor device 404 described with reference to FIG. 20. In an embodiment, the information storage dielectric layer 1620 of the capacitor Cs may include a capacitor dielectric structure and a barrier dielectric layer. Configurations of the capacitor dielectric structure and the barrier dielectric layer may be substantially the same as the configurations of the capacitor dielectric structure 2003 and the barrier dielectric layer 440c of the semiconductor device 404 described with reference to FIG. 20. In an embodiment, a configuration of the plate electrode 1630 of the capacitor Cs may be substantially the same as that of the plate electrode 450c of the semiconductor device 404 of FIG. 20.

In some embodiments not shown, the configurations of the storage node electrode 1610 of the capacitor Cs, the information storage dielectric layer 1620 including the capacitor dielectric structure and the barrier dielectric layer, and the plate electrode 1630 may be substantially the same as the configurations of the storage node electrode 410a, the capacitor dielectric structure 2001, the dielectric structure including the barrier dielectric layer 440a, and the plate electrode 450a of the semiconductor device 401 described with reference to FIG. 17. In this case, the storage node electrode 1610 may have a pillar shape. In some embodiments, the configurations of the storage node electrode 1610 of the capacitor Cs, the information storage dielectric layer 1620 including the capacitor dielectric structure and the barrier dielectric layer, and the plate electrode 1630 may be substantially the same as the configurations of the storage node electrode 410b, the capacitor dielectric structure 2002 and the barrier dielectric layer 440b, and the plate electrode 450b of the semiconductor device 403 described with reference to FIG. 19. In this case, the storage node electrode 1610 may have a pillar shape including the central pillar structure 460. In some embodiments, the configurations of the storage node electrode 1610 of the capacitor Cs, the information storage dielectric layer 1620 including the capacitor dielectric structure and the barrier dielectric layer, and the plate electrode 1630 may be substantially the same as the configurations of the storage node electrode 410d, the capacitor dielectric structure 2004 and the barrier dielectric layer 440d, and the plate electrode 450d of the semiconductor device 405 described with reference to FIG. 21. In this case, the storage node electrode 1610 may have a shape in which a pillar shape and a cylinder shape are combined.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A semiconductor device comprising:
a first electrode and a second electrode that are spaced apart from each other;
a capacitor dielectric structure disposed between the first electrode and the second electrode, and the capacitor dielectric structure including a ferroelectric layer and a dielectric layer; and
a barrier dielectric layer disposed between one of the first and second electrodes and the capacitor dielectric structure, and the barrier dielectric layer including a ferroelectric material,
wherein an absolute value of a capacitance of the barrier dielectric layer is greater than an absolute value of a capacitance of the capacitor dielectric structure, and
a thickness of the barrier dielectric layer is less than a thickness of the capacitor dielectric structure.

2. The semiconductor device of claim 1, wherein the barrier dielectric layer contacts the capacitor dielectric structure.

3. The semiconductor device of claim 1, wherein the ferroelectric layer and the dielectric layer are electrically connected in series between the first electrode and second electrode.

4. The semiconductor device of claim 1, wherein an absolute value of a capacitance of the ferroelectric layer is greater than an absolute value of a capacitance of the dielectric layer.

5. The semiconductor device of claim 1,
wherein the capacitor dielectric structure and the barrier dielectric layer are electrically connected in series to each other to form a dielectric structure, and
wherein a capacitance of the dielectric structure is substantially the same as the capacitance of the capacitor dielectric structure.

6. The semiconductor device of claim 1,
wherein the ferroelectric layer contacts one surface of the dielectric layer, and
wherein the barrier dielectric layer contacts the other surface of the dielectric layer.

7. The semiconductor device of claim 1, wherein the dielectric layer contacts one surface of the ferroelectric layer, and wherein the barrier dielectric layer contacts the other surface of the ferroelectric layer.

8. The semiconductor device of claim 1, wherein the absolute value of the capacitance of the barrier dielectric layer is greater than an absolute value of a capacitance of the ferroelectric layer.

9. The semiconductor device of claim 1, wherein the barrier dielectric layer has a thickness of 1 nm to 5 nm.

10. The semiconductor device of claim 1, wherein the barrier dielectric layer includes hafnium zirconium oxide.

11. The semiconductor device of claim 1, further comprising a dopant doped in the barrier dielectric layer, wherein the dopant includes at least one selected from the group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Gd), and lanthanum (La).

12. The semiconductor device of claim 1, wherein the ferroelectric layer includes hafnium zirconium oxide.

13. The semiconductor device of claim 1, further comprising a dopant doped in the ferroelectric layer, wherein the dopant includes at least one selected from the group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Gd), and lanthanum (La).

14. The semiconductor device of claim 1, wherein the dielectric layer includes at least one of aluminum oxide, yttrium oxide, hafnium oxide, zirconium oxide, and hafnium zirconium oxide.

15. The semiconductor device of claim 1, wherein the ferroelectric layer and the dielectric layer include substantially the same material, wherein the ferroelectric layer has a crystal structure of an orthorhombic crystal system, and wherein the dielectric layer has a crystal structure of a monoclinic crystal system or a tetragonal crystal system.

16. The semiconductor device of claim 1, wherein the ferroelectric layer is disposed on the first electrode, wherein the dielectric layer is disposed on the ferroelectric layer, wherein the barrier dielectric layer is disposed on the dielectric layer, and wherein the second electrode is disposed on the barrier dielectric layer.

17. The semiconductor device of claim 16, further comprising a crystallization seed layer disposed between the first electrode and the ferroelectric layer.

18. The semiconductor device of claim 17, wherein the crystallization seed layer includes at least one selected from zirconium oxide, hafnium oxide, zirconium nitride, hafnium nitride, magnesium oxide, and niobium oxide.

19. The semiconductor device of claim 16, further comprising an interfacial insulation layer disposed between the barrier dielectric layer and the second electrode.

20. A semiconductor device comprising:

a first electrode and a second electrode that are spaced apart from each other;

a capacitor dielectric structure disposed between the first electrode and the second electrode, and the capacitor dielectric structure including a ferroelectric layer and a dielectric layer; and a barrier dielectric layer disposed between one of the first and second electrodes and the capacitor dielectric structure, and the barrier dielectric layer including a ferroelectric material, wherein the capacitor dielectric structure and the barrier dielectric layer are electrically connected in series to each other to form a dielectric structure, and wherein a capacitance of the dielectric structure is substantially the same as a capacitance of the capacitor dielectric structure.

21. A semiconductor device comprising:

a first electrode and a second electrode that are spaced apart from each other;

a capacitor dielectric structure disposed between the first electrode and the second electrode, and the capacitor dielectric structure including a ferroelectric layer and a dielectric layer; and a barrier dielectric layer disposed between one of the first and second electrodes and the capacitor dielectric structure, and the barrier dielectric layer including a ferroelectric material, wherein an absolute value of a capacitance of the barrier dielectric layer is greater than an absolute value of a capacitance of the ferroelectric layer.

* * * * *